(12) United States Patent
Stoppel et al.

(10) Patent No.: US 8,761,222 B2
(45) Date of Patent: Jun. 24, 2014

(54) LIGHT SOURCE WITH A DIODE LASER AND A LARGE NUMBER OF OPTICAL FIBERS

(75) Inventors: Klaus Stoppel, Mundelsheim (DE); Werner Herden, Gerlingen (DE); Hans-Jochen Schwarz, Stuttgart (DE); Andreas Letsch, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 306 days.

(21) Appl. No.: 13/138,525

(22) PCT Filed: Feb. 12, 2010

(86) PCT No.: PCT/EP2010/051780
§ 371 (c)(1),
(2), (4) Date: Nov. 9, 2011

(87) PCT Pub. No.: WO2010/102880
PCT Pub. Date: Sep. 16, 2010

(65) Prior Publication Data
US 2012/0044966 A1 Feb. 23, 2012

(30) Foreign Application Priority Data
Mar. 11, 2009 (DE) .......................... 10 2009 001 468

(51) Int. Cl.
*H01S 3/091* (2006.01)

(52) U.S. Cl.
USPC .............. 372/70; 372/50.12; 372/69; 372/71; 385/49; 385/89

(58) Field of Classification Search
CPC .......... H01S 32/06729; H01S 5/02284; H01S 3/06745; H01S 3/2383; H01S 3/2391; H01S 5/02252; H01S 5/4012; H01S 3/06708; H01S 3/06741; H01S 3/094053; H01S 3/09415; H01S 3/067; H01S 3/094096; H01S 5/02; H01S 3/04; H01S 3/0405; H01S 3/0407; H01S 3/06716; H01S 3/091; H01S 5/4025
USPC .......................... 372/50.12, 69–71; 385/49, 89
See application file for complete search history.

(56) References Cited

U.S. PATENT DOCUMENTS

| 4,603,421 A | * | 7/1986 | Scifres et al. | .............. 372/50.12 |
| 4,812,002 A | * | 3/1989 | Kato et al. | ...................... 385/33 |
| 5,022,043 A | * | 6/1991 | Jacobs | ............................. 372/95 |

(Continued)

FOREIGN PATENT DOCUMENTS

| CN | 1598625 | 3/2005 |
| CN | 200976052 | 11/2007 |

(Continued)

OTHER PUBLICATIONS

Machine translation of JP02006-301415.*

Primary Examiner — Jessica Stultz
Assistant Examiner — Delma R Forde
(74) Attorney, Agent, or Firm — Kenyon & Kenyon LLP

(57) ABSTRACT

A light source, e.g., for optical excitation of a laser device, includes a diode laser having a large number of emitters and a light-guiding device, the light-guiding device including a large number of optical fibers. Each fiber has a first end and a lateral surface, the first ends being arranged relative to the emitters in such a manner that light generated by the emitters is coupled into the first ends of the optical fibers, the optical fibers being arranged in abutting relationship along their lateral surfaces at least in the region of their first ends. The optical fibers are connected in the region of their first ends to a fiber support.

25 Claims, 16 Drawing Sheets

(56) References Cited

U.S. PATENT DOCUMENTS

| | | | |
|---|---|---|---|
| 5,546,487 A | | 8/1996 | Fantone |
| 5,629,997 A | * | 5/1997 | Hardy, Jr. .................. 385/33 |
| 5,835,659 A | * | 11/1998 | Ota et al. .................. 385/137 |
| 5,991,492 A | * | 11/1999 | Ota et al. .................. 385/137 |
| 6,112,002 A | * | 8/2000 | Tabuchi .................. 385/50 |
| 6,553,174 B2 | * | 4/2003 | Winer .................. 385/137 |
| 6,690,873 B2 | * | 2/2004 | Bendett et al. .................. 385/132 |
| 7,845,328 B2 | * | 12/2010 | Herden et al. .................. 123/143 B |
| 2002/0110328 A1 | * | 8/2002 | Bischel et al. .................. 385/49 |
| 2010/0202733 A1 | * | 8/2010 | Herden .................. 385/39 |
| 2010/0252546 A1 | * | 10/2010 | Herden et al. .................. 219/205 |
| 2012/0068369 A1 | * | 3/2012 | Stoppel et al. .................. 264/1.28 |

FOREIGN PATENT DOCUMENTS

| | | |
|---|---|---|
| DE | 10 2004 006 932 | 10/2005 |
| DE | 10 2005 057 617 | 6/2007 |
| DE | 10 2007 061 655 | 8/2009 |
| JP | 63-98607 | 4/1988 |
| JP | 6-317716 | 11/1994 |
| JP | 7-294755 | 11/1995 |
| JP | 2001-15834 | 1/2001 |
| JP | 2003-294989 | 10/2003 |
| JP | 2006-301415 | 11/2006 |
| WO | WO 2008/022914 | 2/2008 |
| WO | WO 2009/037036 | 3/2009 |

* cited by examiner

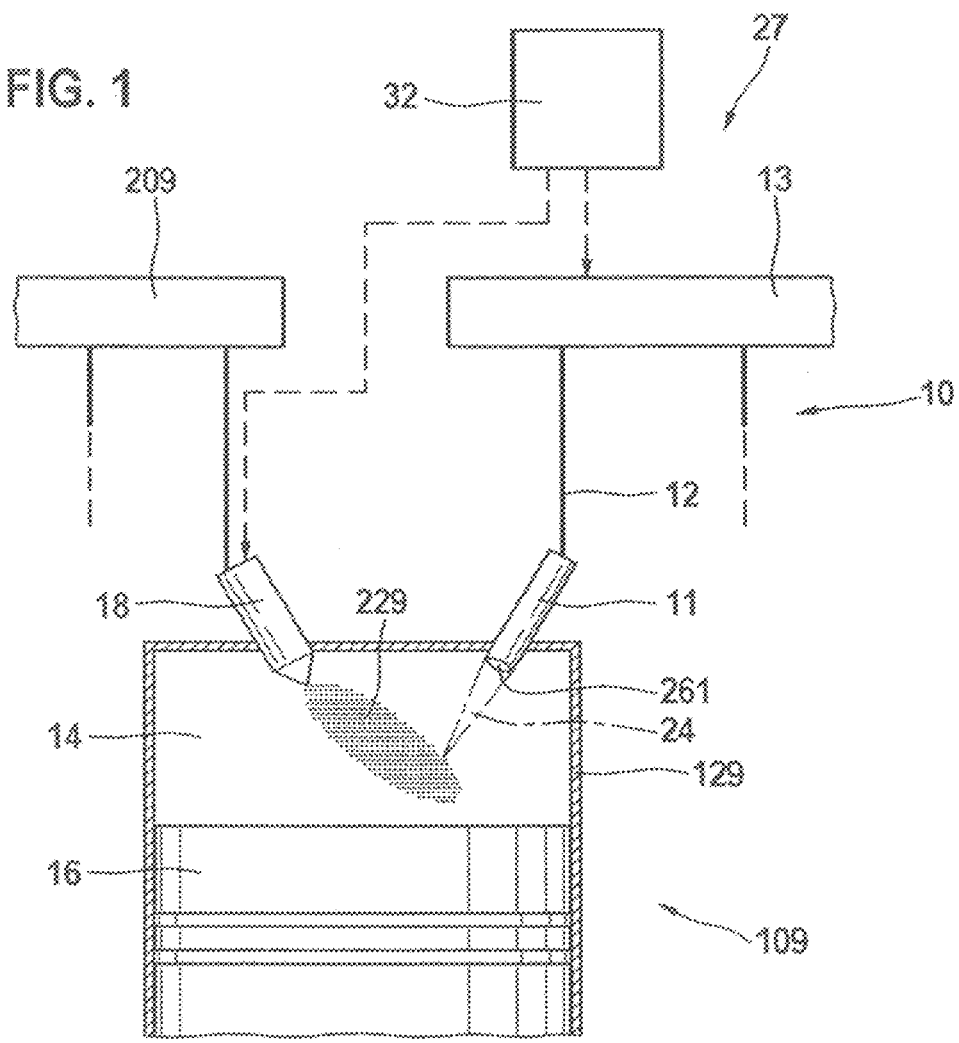
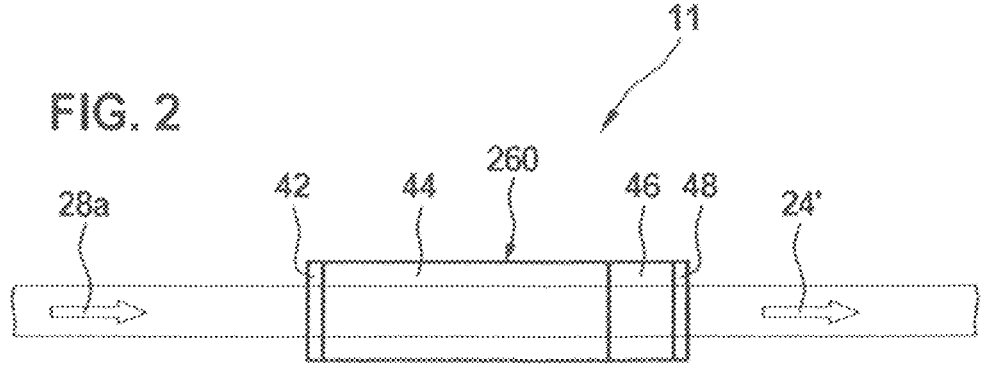

121, 1211, 1216    1213    1214    1215

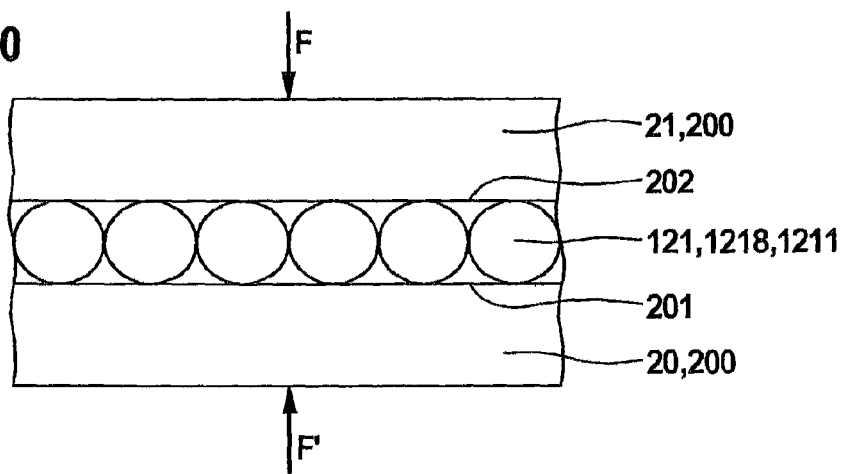
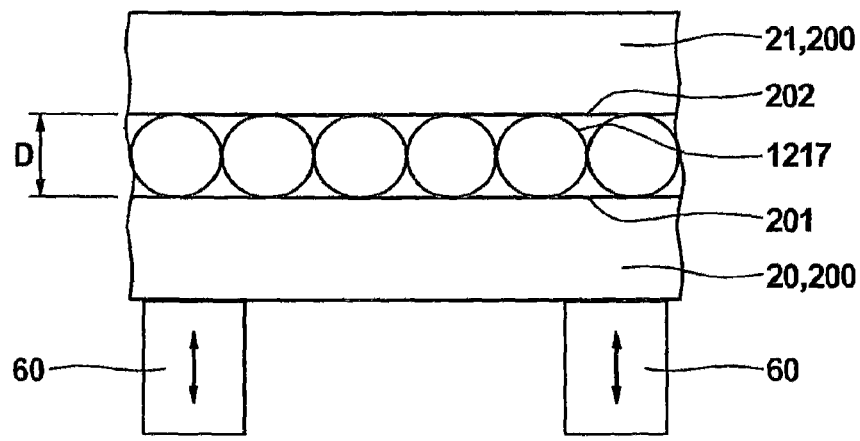

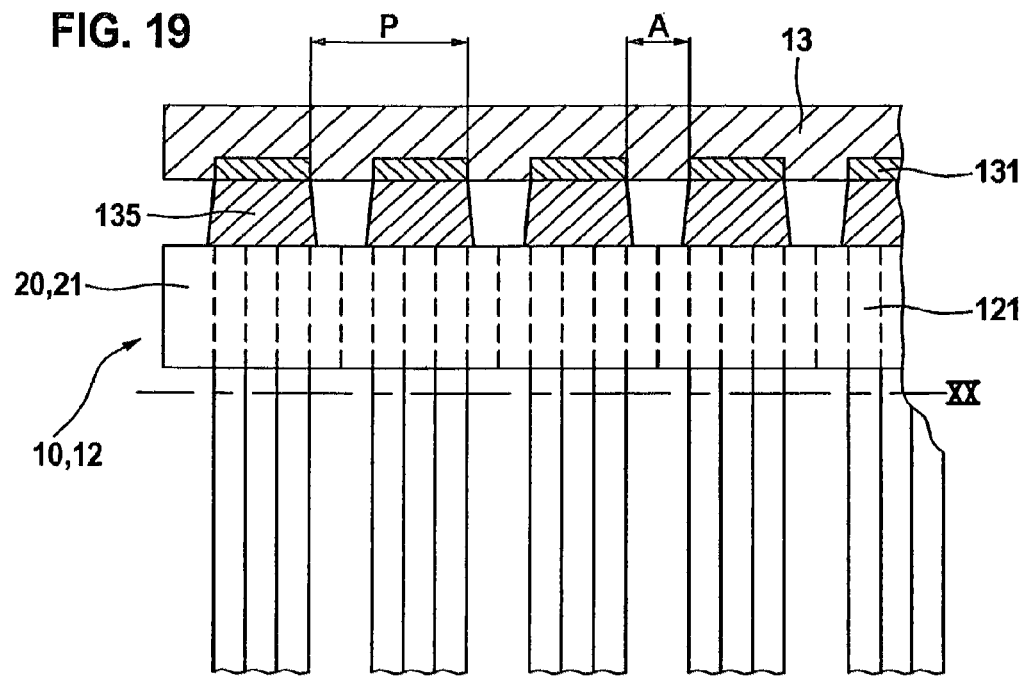
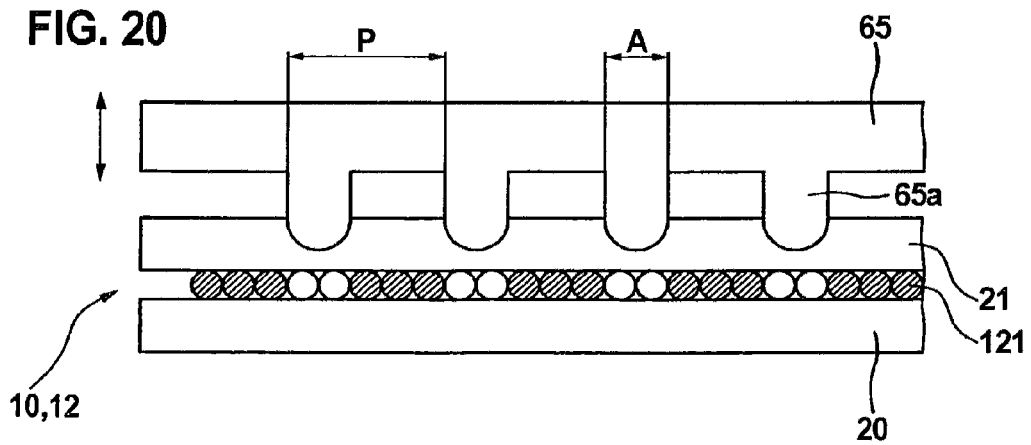

LIGHT SOURCE WITH A DIODE LASER AND A LARGE NUMBER OF OPTICAL FIBERS

BACKGROUND OF THE INVENTION

1. Field of the Invention

The present invention relates to a light source with a diode and optical fibers.

2. Description of Related Art

A light source of the above-noted kind is known from published German Patent document DE 10 2004 006 932 B3 and has a diode laser bar with a large number of narrow emitters arranged one beside another in a row in the direction of their longitudinal axis. Associated with the diode laser bar is a device for beam guiding and beam shaping of the laser beam emerging from the diode laser bar, which device contains a large number of light-guide fibers arranged one beside another in a row, into which the laser beam is coupled. It is provided that the light-guide fibers are gathered together on the opposite side to form a bundle, excluding from the bundle any non-irradiated optical fibers lying between the emitters which are spaced apart from one another in the diode laser bar.

One disadvantage with the light source known from the related art is that the mechanical strength of the device for beam guiding and beam shaping is low in the region in which input coupling of the laser beam takes place, thus making it difficult to handle the device for beam guiding and beam shaping. Moreover, its durability is reduced. It is a first aspect and the object of the present invention to overcome that disadvantage.

A further disadvantage with the light source known from the related art is that the bundle also contains fibers into which only comparatively little light is coupled. In that manner, the beam density at the outlet of the device for beam guiding and beam shaping and the usability of the light emerging from the device for beam guiding and beam shaping, for example for optically pumping a solid-state laser, are reduced. It is a second aspect of the present invention to overcome that disadvantage.

A third aspect of the present invention is to provide a light source with which a high proportion of the emission of a diode laser is coupled into a light-guiding device and is transmitted in the light-guiding device.

Further aspects of the present invention are concerned with the production of light sources of the kind disclosed herein.

It is known from published German Patent document DE 10 2004 006 932 B3 to produce a light source by arranging round optical fibers one beside another in an end section and placing them by their end region in a mold in which they are brought into a rectangular cross-section by a hot-pressing process, with the fibers arranged one beside another in the end region fusing together.

In the case of the method known from the related art, only a single device for beam guiding and beam shaping is produced per work cycle consisting of arrangement and hot-pressing of fibers. Furthermore, the arrangement of light-guide fibers in an end portion is comparatively time-consuming. The method known from the related art accordingly has the disadvantage of low profitability. A first further aspect of the present invention is to provide a method in which at least two light-guiding devices are produced per work cycle.

When carrying out the methods in question, especially on an industrial scale, it is extremely important that reshaping of the fibers to the desired extent actually takes place, but on the other hand that excessive compression of the fibers is reliably prevented. A second further aspect of the present invention is therefore provide methods in which it is ensured that a defined reshaping of the fibers takes place with a high degree of accuracy.

BRIEF SUMMARY OF THE INVENTION

Light sources according to the present invention have the advantage that the mechanical strength in the region of the first ends of the optical fibers is high, so that the light-guiding device may be handled without any problem and is distinguished by having a high durability.

In accordance with the present invention, in the case of a light source, especially for optical excitation of a laser device, for example a laser device of a laser ignition system of an internal combustion engine, including a diode laser having a large number of emitters and a light-guiding device, the light-guiding device including a large number of optical fibers and each optical fiber having a first end and a lateral surface, the first ends of the optical fibers being arranged relative to the emitters in such a manner that light generated by the emitters is coupled into the first ends of the optical fibers, the optical fibers being arranged in abutting relationship along their lateral surfaces at least in the region of their first ends, that is achieved by virtue of the fact that the optical fibers are connected in the region of their first ends to a fiber support.

A first end of an optical fiber is to be understood herein as being an end of an optical fiber in the direction of its longitudinal axis, for example in the case of a cylindrical fiber a base surface of the cylinder. A lateral surface of an optical fiber is to be understood herein as being the surface delimiting an optical fiber perpendicular to its longitudinal axis, for example in the case of a cylindrical fiber the circumferential surface of the cylinder. Optical fibers arranged in abutting relationship along their lateral surfaces are to be understood as being optical fibers all of which or almost all of which, for example more than 90% of which, are in contact with directly adjacent optical fibers along their lateral surfaces.

In the case of a light source having a light-guiding device, the light-guiding device including a large number of optical fibers, the optical fibers being connected in the region of their first ends to a fiber support, the region of the first ends of the fibers is to be regarded as the entire region in which the fibers are connected to the fiber support.

Advantageously, an especially high mechanical strength of the light-guiding device is obtained if the fiber support is connected to the lateral surfaces of the fibers in the region of the first ends of the optical fibers and/or if the fiber support ends flush with the fibers in the longitudinal direction of the optical fibers and/or if the formation of an integral connection occurs between the optical fibers and the fiber support.

Advantageously, an especially high mechanical strength of the light-guiding device is obtained if, in addition to having the fiber support, the light-guiding device has a second fiber support, the optical fibers being disposed between the fiber supports. In this case also, the mechanical strength of the light-guiding device is increased if there is a connection, especially an integral connection, between the second fiber support and the optical fibers and/or if the second fiber support ends flush with the optical fibers in the longitudinal direction of the optical fibers and/or ends flush with the fiber support.

By choosing suitable materials for the optical fibers and for the fiber support(s) it is possible to obtain the advantage that the device according to the present invention is capable of being produced in an especially simple manner.

Advantageously, the optical fibers consist of one or more first types of glass and the fiber support or the fiber supports consist(s) of one or more second types of glass and the softening temperature of the second type of glass or the softening temperatures of the second types of glass has/have a higher value than the softening temperature of the first type of glass or the softening temperatures of the first types of glass. In that case, it is possible to implement selectively a deformation of the optical fibers while largely avoiding deformation of the fiber support(s).

Advantageously, the optical fibers consist of one or more first types of glass and the fiber support or the fiber supports consist(s) of one or more second types of glass and the hardness at room temperature of the second type of glass or the hardnesses at room temperature of the second types of glass has a higher value than the hardness at room temperature of the first type of glass or the hardnesses at room temperature of the first types of glass. In that case, it is possible to carry out a finishing operation on the light-guiding device, for example polishing, in which scratching of the end faces of the optical fibers due to abrasion of the fiber support(s) is eliminated.

Advantageously, the optical fibers consist of one or more first types of glass and the fiber support or the fiber supports consist(s) of one or more second types of glass and the coefficient of thermal expansion of the second type of glass or the coefficients of thermal expansion of the second types of glass is of approximately the same value as the coefficient of thermal expansion of the first type of glass or the coefficients of thermal expansion of the first types of glass. In that case, the occurrence of stresses and cracks in the light-guiding device is reliably eliminated even in the case of temperature cycling.

Advantageously, the optical fibers have, at least in the region of their first ends, a flattened shape in the regions in which they are in contact with one another and/or in the regions in which they are in contact with the fiber support or with the fiber supports, which flattened shape manifests itself in the cross-sections of the fibers having a greater radius of curvature in those regions than in the regions in which they are neither in contact with one another nor in contact with the fiber support or with the fiber supports. As a result of the flattening, the contact area between the fibers and the fiber support or the fiber supports becomes larger, so that a more durable connection is produced between those parts. Moreover, the space in front of the emitters of the diode laser is filled with optical fibers in a better manner, with the result that coupling into the light-guiding device is improved. In an especially advantageous embodiment, the fibers are flattened along their lateral surface and/or in the region of their first ends to such an extent or over such a large area that they have a rectangular or trapezoidal cross-section.

Since a round cross-sectional surface of the fibers enables light to be guided within the fibers with little loss, but is unfavorable for coupling-in, an advantageous development of the present invention provides that the cross-sections of the fibers within the region of their first ends change from the first end of the fibers to the second of the fibers from a shape that is very different from a round shape, for example a rectangular or trapezoidal or at least almost rectangular or trapezoidal shape, to a round or almost round shape.

To improve mechanical stability and to reduce optical losses, it is advantageous if that change takes place continuously, especially continuously over the entire region in which the fibers are disposed on the fiber support or on the fiber supports.

The mechanical stability of the fibers is also improved if the shape of the cross-sectional surface of the fibers at the transition from the region in which the fibers are disposed on the fiber support or on the fiber supports to the region in which the fibers are not disposed on the fiber support or on the fiber supports does not change abruptly, but remains largely unchanged, especially remains round.

In accordance with the present invention, light sources, especially of the kind described, are produced by arranging a large number of optical fibers on a fiber support, heating the arranged optical fibers in the region of their first ends and by the formation of a connection, especially an integral connection, subsequently occurring between the heated optical fibers and the fiber support or the fiber supports.

In that regard, the method may be carried out in an especially reproducible manner if the arrangement of the optical fibers is such that they are arranged in abutting relationship with one another along their lateral surfaces at least in the region of their first ends.

Advantageously, a connection is brought about in an accelerated manner if, on heating of the optical fibers, a softening of the optical fibers takes place and/or if the optical fibers are disposed between the fiber support and a counter-surface, the force that acts on the optical fibers acting on the optical fibers by virtue of the counter-surface. In that case, improved conduction of heat is obtained and an especially intensive contact between the individual surfaces is obtained.

The second aspect of the present invention is considered in the case of a light source, especially for optical excitation of a laser device, for example a laser device of a laser ignition system of an internal combustion engine, including a diode laser having a large number of emitters and a light-guiding device, the light-guiding device including a large number of optical fibers and each fiber having a first end, a second end and a lateral surface, the first ends being arranged relative to the emitters in such a manner that light generated by the emitters is coupled into the first ends of the optical fibers, the optical fibers being arranged in abutting relationship along their lateral surfaces at least in the region of their first ends, by proposing that a first fraction of the optical fibers be gathered together in the region of their second ends to form a bundle, the first fraction of the optical fibers consisting of those fibers into which a proportion of the light coupled overall into the fibers by the emitters is coupled in each case, the proportion lying above a first limit value that is other than zero.

That aspect of the present invention is based on the consideration that the inclusion in the bundle of fibers into which only little light is coupled leads to a reduction in the beam density provided by the light source. At the same time, however, it should be borne in mind that excluding from the bundle optical fibers into which light is coupled results in a reduction in the radiation power provided by the light source. The present invention is also based on the realization that, depending on specific characteristics of the diode laser and of the optical fibers, especially geometrical characteristics of the diode laser and of the optical fibers, and depending on the purpose for which the light source is used, for example for pumping a solid-state laser, either optimization of the radiation power or optimization of the radiation density is required, and the invention is further based on the realization that it is possible to take that into consideration by specifying a first limit value that is other than zero and by including a fiber in the bundle precisely when there is coupled into that fiber a proportion of the emission of the diode laser that is greater than the first limit value. Against the background of those considerations and realizations, a person skilled in the art will be able to find the first limit value by simple analysis, for example by making a series of measurements.

The first limit value may, for example, be the product of the reciprocal of the number of optical fibers of the light-guiding device and a predefined factor, the factor being greater than or equal to 0.03, especially between 0.07 and 0.2, and, for example, 0.1.

In addition or alternatively, the first limit value may be the product of the ratio between the highest radiation power coupled into one of the optical fibers and the total radiation power of the diode laser, and a predetermined factor, the factor being greater than or equal to 0.03, especially between 0.07 and 0.5, and, for example, 0.2.

Advantageously, it is also possible, however, to provide a light source that provides an optimum beam density and, at the same time, an optimum radiation power. For this, it is provided that at least some of those optical fibers not belonging to the first fraction of the fibers belong to a second fraction of the optical fibers and that the second fraction of the optical fibers is arranged around the bundle in the region of the second ends of the fibers.

It is possible, for example, for the second fraction of the optical fibers to contain those optical fibers that do not belong to the first fraction.

Advantageously, there may belong to the second fraction of the optical fibers only those optical fibers into which a proportion of the emission of the diode laser is coupled in each case, the proportion lying above a second limit value that is other than zero.

It will be appreciated that further fractions of the optical fibers may analogously be excluded and gathered together in the region of the second ends of the optical fibers. Furthermore, it is possible for the beam profile of the emission of the light source to be freely selected within certain limits by specific arrangement of fibers in the region of their second ends.

It is thus possible, for example, for optical fibers to be gathered together to form a bundle in the region of their second ends, with optical fibers into which a greater proportion of the emission of the diode laser is coupled being arranged more centrally in the bundle than are optical fibers into which a smaller proportion of the emission of the diode laser is coupled. It is advantageously possible in that manner to generate emissions of the light source that are similar to so-called Gaussian beams.

Light sources, especially light sources for optical excitation of a laser device, for example a laser device of a laser ignition system of an internal combustion engine, especially light sources of the kind disclosed herein, may be produced by a method that provides for arrangement of a large number of optical fibers in front of a large number of emitters of a diode laser, the fibers being arranged in abutting relationship with one another along their lateral surfaces at least in the region of their first ends, the emission of the emitters being coupled into the first ends of the optical fibers, the method further providing for the detection of the radiation power coupled into the fibers and also providing for the gathering together of the first fraction of the fibers to form a bundle in the region of their second ends, the first fraction of the optical fibers including those optical fibers into which a proportion of the light generated in total by the emitters is coupled in each case, the proportion lying above a first limit value that is other than zero.

It is possible in principle for optical fibers to be selected on the basis of the arrangement of their first ends relative to the emitters of the diode laser. It is considerably more efficient, and hence advantageous, however, for the optical fibers to be selected on the basis of measurement of the radiation power emerging from their second ends or on the basis of measurement of the stray radiation emerging laterally from the optical fibers.

Further enhancements of the efficiency of the method are advantageously possible by taking a measurement of the radiation power of a plurality, especially all, of the optical fibers simultaneously, for example with a CCD camera. Further enhancements of the efficiency of the method are possible by automating further processing of the optical fibers, especially the severing of optical fibers, and by performing such further processing in dependence on the result of the measurement.

It is further possible for the bundle to be compacted laterally, that is to say perpendicularly to the longitudinal axis of the fibers, in the region of the second ends of the fibers, under the action of heat and force.

Preferably, the first fraction of the optical fibers includes those optical fibers at whose second ends radiation of a peak power density of more than 10 $kW/cm^2$ emerges at least intermittently.

The third aspect of the present invention is considered in the case of a light source, especially for the optical excitation of a laser device, for example a laser device of a laser ignition system of an internal combustion engine, including a diode laser having a large number of emitters and a light-guiding device, the light-guiding device including a large number of optical fibers and each fiber having a first end and a lateral surface, the first ends being arranged relative to the emitters in such a manner that light generated by the emitters is coupled into the first ends of the optical fibers, the optical fibers being arranged in abutting relationship along their lateral surfaces at least in the region of their first ends, by proposing that the optical fibers have a fiber core and a fiber cladding, the cross-sectional surface of the fiber cladding being small in comparison with the cross-sectional surface of the fiber core at least in the region of the first ends.

That may be accompanied, in particular, by the thickness of the fiber cladding being small in comparison with the cross-sectional surface of the fiber core at least in the region of the first ends.

Owing to the small cross-sectional surface and/or the small thickness of the fiber cladding in comparison with the cross-sectional surface of the fiber core in the region of the first ends, it is possible for a high proportion of the emission of the diode laser to be coupled into fiber cores and be guided therein with little loss. That greatly reduces the proportion of the emission of the diode laser that impinges on the end face of a fiber in the region of the fiber cladding and that is not capable of being guided therein or that is capable of being guided therein only with high losses.

It is provided in particular that the fiber cladding surrounds the fiber core in the direction perpendicular to the longitudinal axis of the fibers at least to a large extent, for example over at least 99.5% of the outer surface of the fiber core.

An optical fiber having a fiber core and a fiber cladding, in which the cross-sectional surface of the fiber cladding is small in comparison with the cross-sectional surface of the fiber core at least in the region of the first ends may be assumed especially when the cross-sectional surface of the fiber cladding is not greater than 30% of the cross-sectional surface of the fiber core, especially not greater than 10% of the cross-sectional surface of the fiber core or even not greater than 5% of the cross-sectional surface of the fiber core, at least in the region of the first ends.

An optical fiber having a fiber core and a fiber cladding, in which the thickness of the fiber cladding is small in comparison with the cross-sectional surface of the fiber core at least in the region of the first ends may be assumed especially when the thickness of the fiber cladding is not greater than 7% of the square root of the cross-sectional surface of the fiber core, especially not greater than 3% of the square root of the cross-sectional surface of the fiber core, at least in the region of the first ends.

Advantageously, a high proportion of the emission of a diode laser is coupled into a light-guiding device and is transmitted in the light-guiding device if the cross-sectional surface of the fiber core is greater than 70%, especially greater than 90% and even greater than 95%, of the cross-sectional surface of the fibers, at least in the region of the first ends.

Advantageously, a high proportion of the emission of a diode laser is coupled into a light-guiding device and is transmitted in the light-guiding device if the thickness of the fiber cladding is not less than the product of the wavelength of the light generated by the diode laser and the numerical aperture of the fiber, at least in the region of the first ends, since in that manner it is possible to avoid the effect of frustrated total reflection which leads to light losses in the optical fibers in the case of a fiber cladding that is too thin.

Advantageously, a high proportion of the emission of a diode laser is coupled into a light-guiding device if the optical fibers have a numerical aperture of at least 0.4 or have a numerical aperture that corresponds to at least the sine of half the divergence angle of the emission of the emitters in the fast axis.

Advantageously, low optical losses are obtained on coupling into the fibers and a high proportion of the emission of a diode laser is coupled into a light-guiding device if the first ends of the optical fibers have a polish and/or an anti-reflection coating and/or if the space through which radiation passes between the emitters and the optical fibers is completely filled with an optically homogeneous medium, for example an optical gel, especially if the refractive index thereof is suitably selected. For this, the refractive index of the optically homogeneous medium, for example the optical gel, should be equal to or approximately equal to, for example not more than 15% different from or even not more than 3% different from, the refractive index of the fiber, especially not more than 15% different from the refractive index of the fiber core, especially not more than 3% different from the refractive index of the fiber core. It is further preferred that the refractive index of the optically homogenous medium, for example the optical gel, be not greater than the refractive index of the fiber, especially not greater than the refractive index of the fiber core, but up to 15%, especially up to 3%, lower.

It may be provided, in particular, that the first ends of all or almost of the optical fibers, for example at least 95% of the optical fibers, of the light-guiding device are collectively provided with a polish or with an anti-reflection coating.

Advantageously, a high proportion of the emission of a diode laser is coupled into a light-guiding device if the first ends of the optical fibers are arranged opposite the emitters and at a distance of only a few micrometers.

In addition or alternatively, the third aspect of the present invention is considered in the case of a light source, especially for optical excitation of a laser device, for example a laser device of a laser ignition system of an internal combustion engine, including a diode laser having a large number of emitters and a light-guiding device, the light-guiding device including a large number of optical fibers and each fiber having a first end and a lateral surface, the first ends being arranged relative to the emitters in such a manner that light generated by the emitters is coupled into the first ends of the optical fibers, the optical fibers being arranged in abutting relationship along their lateral surfaces at least in the region of their first ends, by proposing that the optical fibers each have a fiber core, a fiber cladding and fiber coating, the fiber core consisting of a first material, the fiber cladding consisting of a second material and the fiber coating consisting of a third material, the first material having a refractive index for the light generated by the diode laser of $n_1$, the second material having a refractive index for the light generated by the diode laser of $n_2$, and the third material having a refractive index for the light generated by the diode laser of $n_3$, and where $n_1 > n_2 > n_3 > 1$.

That choice of the refractive indices $n_1$, $n_2$ and $n_3$ has the result that the part of the emission of the diode laser that at the first end of an optical fiber is coupled into the fiber core is guided therein through the optical fiber and reaches the second end of the optical fiber and, at the same time, the part of the emission of the diode laser that is coupled into the fiber cladding is at least to some extent guided within the light-guide fiber and reaches the second end of the optical fiber, the light-guiding in the optical fiber of the part of the emission of the diode laser that is coupled into the fiber cladding being based on total reflection at the boundary between fiber cladding and fiber coating.

In particular, it is provided that the fiber cladding surrounds the fiber core in the direction perpendicular to the longitudinal axis of the optical fibers at least to a large extent, for example over at least 99.5% of the outer surface of the fiber core.

It is further provided, in particular, that the structure composed of fiber core and fiber cladding is surrounded by the fiber coating in the direction perpendicular to the longitudinal axis of the fibers at least to a large extent, for example over at least 99.5% of the outer surface of the structure composed of fiber core and fiber cladding.

It is further provided, in particular, that the fiber coating forms an external covering of the optical fiber in the direction perpendicular to the longitudinal axis of the optical fiber.

Advantageously, a high proportion of the emission of a diode laser is coupled into a light-guiding device and is transmitted in the light-guiding device if the fiber coating has a thickness in the range of less than one micrometer, especially a thickness in the range of 0.02-0.1 micrometer, since in that case the proportion of the light coupled into the fiber coating is particularly small.

Advantageously, a high proportion of the emission of a diode laser is coupled into a light-guiding device and is transmitted in the light-guiding device if, as an alternative or in addition, the refractive index $n_3$ of the fiber coating is 1%-15% lower than the refractive index $n_2$ of the fiber cladding and/or is at least 1.3.

Advantageously, a high proportion of the emission of a diode laser is coupled into a light-guiding device and is transmitted in the light-guiding device if the fiber cladding has a thickness in the range of from one to a few micrometers, especially a thickness in the range of 1-5 micrometers, since in that case the proportion of the light coupled into the fiber cladding is particularly small, but at the same time the effect of frustrated total reflection at the boundary between fiber cladding and fiber core may also be reliably eliminated.

It is possible, for example, to achieve an effect whereby the attenuation of the light coupled into the fiber cladding is not greater than approximately twice to three times as high as the attenuation of the light coupled into the fiber core.

It may be provided, for example, that the first material and/or the second material is a type of glass. For the third material, lacquers or plastics materials are also employed.

It may be provided, for example, that the optical fibers are deformed in such manner, at least in the region of their first ends, starting from a round cross-section, and are so arranged that increased coupling-in of the emission of the diode laser takes place.

The first further aspect of the present invention is considered by proposing the production of a light source, especially a light source for optical excitation of a laser device, for example a laser device of a laser ignition system of an internal combustion engine, including a diode laser having a large number of emitters and a light-guiding device, the light-guiding device including a large number of optical fibers and each fiber having a first end and a lateral surface, the first ends being arranged relative to the emitters in such a manner that light generated by the emitters is coupled into the first ends of the optical fibers, the optical fibers being in abutting relationship along their lateral surfaces at least in the region of their first ends, by arranging a large number of optical fibers at least in a fiber section. It is further provided that, within the fiber section, the formation of a direct or an indirect, especially an integral, connection occurs between the arranged optical fibers, and the optical fibers are then severed within the fiber section.

Following severing of the fibers, therefore, there are at least two light-guiding devices.

Advantageously, it is possible to accelerate the production of a direct or an indirect, especially an integral, connection between the arranged optical fibers if the optical fibers are heated and/or if softening of the optical fibers occurs and/or if deformation of the optical fibers occurs.

It is provided, in particular, that the optical fibers are arranged in abutting relationship along their lateral surfaces at least in the fiber section.

Advantageously, it is possible to accelerate the production process, especially the production of a direct or an indirect integral connection between the arranged optical fibers, if the optical fibers are arranged on a fiber support in the region of the fiber section, especially if a force is applied to the optical fibers, the force being oriented perpendicularly or almost perpendicularly to the contact surface of the optical fibers on the fiber support.

It is provided, in particular, that on severing of the deformed fibers, the fiber support is also severed.

It is advantageous for the formation of a connection, especially an integral connection, to occur between the arranged optical fibers and the fiber support, in which case the fiber support connected to the optical fibers is also severed on severing of the arranged optical fibers.

If a direct integral bond between the optical fibers is avoided, optical crosstalk between the individual fibers is not to be expected or is to be expected only to a small degree.

In one embodiment, it is provided that, during the action of a force on the optical fibers, the optical fibers are disposed between a fiber support and a counter-surface, the optical fibers being pressed between the counter-surface and the fiber support. In that case, it is possible on the one hand for the counter-surface to consist of at least one heat-resistant material that does not form a connection to the optical fibers even at temperatures of 800° C., for example SiC. On the other hand, it is possible for the counter-surface to be part of a second fiber support, the second fiber support bonding, especially integrally bonding, to the optical fibers, in which case the second fiber support bonded to the optical fibers is also severed on severing of the arranged optical fibers. In a special embodiment of the method, it is provided that, after deformation of the optical fibers, the optical fibers completely or almost completely fill (for example by more than 95% or by from 90% to 99%) the space between the fiber support and the counter-surface over the width in which the optical fibers are arranged on the fiber support.

Advantageously, severing of the optical fibers takes place within the fiber section in such a manner that approximately a right angle, especially an angle between 89° and 91°, exists between the cut face and the longitudinal axes of the optical fibers. In that manner, the distance to be severed is minimized and the economic efficiency of the method is optimized.

Advantageously, the fibers are arranged in such a manner that the fiber section in which the optical fibers are connected to one another and in which the optical fibers are severed lies in the region of the middle of the optical fibers, so that, on being severed, the optical fibers are divided into two fiber pieces of approximately equal length.

Severing of the optical fibers may be carried out by using an infrared laser, especially by using a $CO_2$ laser.

Advantageously, severing of the fibers may take place in a first and in at least one second step, the first cut being made approximately perpendicularly to the longitudinal axes of the fibers, and the second cut being made along the longitudinal axes of the fibers. In that manner, at least four light-guiding devices are produced per work cycle, thereby further optimizing the economic efficiency of the method.

It is also economically possible for the light-guiding devices to be subjected, especially collectively, to polishing and/or coating, especially after the first and before the second cut. The second further aspect of the present invention is considered by proposing the production of a light source, especially a light source for optical excitation of a laser device, for example a laser device of a laser ignition system of an internal combustion engine, including a diode laser having a large number of emitters and a light-guiding device, the light-guiding device including a large number of optical fibers and each optical fiber having a first end and a lateral surface, the first ends being arranged relative to the emitters in such a manner that light generated by the emitters is coupled into the first ends of the optical fibers, the optical fibers being arranged in abutting relationship along their lateral surface at least in the region of their first ends, the production method having the following steps:
arranging a large number of optical fibers that form, in a sub-region, a fiber section disposed between two opposing pressing faces,
heating the fiber section,
applying a force to the heated optical fibers through the pressing faces, the force and the heating resulting initially in a deformation of the heated optical fibers, the force applied and/or a temperature of the optical fibers being so selected that the deformation ceases when the optical fibers first fill a region between the pressing faces at least to a large extent.

The method is based on the realization that, in the case of optical fibers arranged in abutting relationship between two pressing faces, there are initially free volumes in the region of the optical fibers between the pressing faces, and that it is possible to discover method parameters such that reshaping of the optical fibers into the initially free volumes is possible, but further reshaping does not take place when the optical fibers first fill a region between the pressing faces at least to a large extent.

Those method parameters may include, for example, one or all of the following variables: minimum temperature of the fibers during reshaping, maximum temperature of the fibers during reshaping, minimum force between the pressing faces during reshaping, maximum force between the pressing faces during reshaping. It is especially advantageous to provide for heating of the optical fibers to at least a minimum temperature and for pressing of the optical fibers via the pressing faces with at least a minimum force, and to select the minimum force and the minimum temperature such that reshaping of the optical fibers is possible, but when the optical fibers first fill the region between the pressing faces at least to a large extent, further deformation of the optical fibers ceases by virtue of the fact that heating of the optical fibers to at most a maximum temperature is provided and pressing of the fibers via the pressing faces to at most a maximum force is provided, and the maximum force and the maximum temperature are selected such that further reshaping of the optical fibers is impossible when the optical fibers fill a region between the pressing faces at least to a large extent.

In particular, it is advantageously possible for the method to be carried out in such a manner that the deformation ceases without this requiring a change in the acting force or the temperature and/or in such a manner that the deformation ceases while the force exerted and/or the temperature of the fibers is/are kept largely constant.

In particular, it is provided that the optical fibers are arranged in abutting relationship along their lateral surfaces at least in the fiber section.

In particular, it is provided that the deformation of the heated optical fibers ceases when more than 95%, especially more than 99.5%, of a region between the pressing faces has been filled.

Advantageously, at least one of the pressing faces is part of a fiber support and the formation of a connection, especially an integral connection, occurs between the optical fibers and the fiber support.

Alternatively or in addition, it is advantageous for one of the pressing faces to be part of a fiber support and for the opposite, other pressing face to be part of a second fiber support, and for the formation of a connection, especially an integral connection, to occur between the optical fibers and the second fiber support.

On the other hand, it is preferred that a direct, especially integral, connection between the fiber support and the second fiber support be avoided.

To improve the accuracy of the reshaping of the optical fibers, it is advantageous for the optical fibers to consist of one or more first types of glass and for the fiber support or the fiber supports to consist of one or more second types of glass, and for the softening temperature of the second type of glass or the softening temperatures of the second types of glass to have a higher value than the softening temperature of the first type of glass or the softening temperatures of the first types of glass. When the types of glass are chosen accordingly, it is ensured in that manner that reshaping of the fibers, but not of the fiber supports takes place under the action of the force. Preferably, the softening temperatures of the first and second types of glass are more than 20K apart from each other.

It is further preferred that the optical fibers consist of one or more first types of glass and the fiber support or the fiber supports consist of one or more second types of glass, and that the hardness at room temperature of the second type of glass or the hardnesses at room temperature of the second types of glass has a higher value than the hardness at room temperature of the first type of glass or the hardnesses at room temperature of the first types of glass.

In alternative embodiments, one or both of the pressing faces consist(s) of at least one heat-resistant material that does not form a connection to the optical fibers even at temperatures of 700° C., for example SiC.

In one embodiment, it is provided that the heating of the arranged optical fibers is carried out within the fiber section by heating the optical fibers via at least one, especially via at least both, of the pressing faces, especially by using at least one electrical resistance heater. Alternatively or in addition, an induction heater may be used, so that the heating-up time is reduced.

In addition or as an alternative, the second further aspect of the present invention is considered by proposing the production of a light source, especially a light source for optical excitation of a laser device, for example a laser device of a laser ignition system of an internal combustion engine, including a diode laser having a large number of emitters and a light-guiding device, the light-guiding device including a large number of optical fibers and each optical fiber having a first end and a lateral surface, the first ends being arranged relative to the emitters in such a manner that light generated by the emitters is coupled into the first ends of the optical fibers, the optical fibers being arranged in abutting relationship along their lateral surfaces at least in the region of their first end, the production method having the following steps:
arranging a large number of fibers that form, in a subregion, a fiber section disposed between two opposing pressing faces,
heating the fiber section,
deforming the fiber section by applying a force to the heated fibers through the pressing faces, the height of the gap remaining between the pressing faces during the application of the force being determined, and the application of force being brought to an end when the determined height of the gap remaining between the pressing faces reaches or exceeds a predefined value.

It is provided, in particular, that the optical fibers are arranged in abutting relationship along their lateral surfaces at least in the fiber section.

Advantageously, the value of the predefined height is so selected that, when the application of force is brought to an end, the fibers fill a region between the pressing faces at least to a large extent.

It is provided, in particular, that, to deform the optical fibers, the pressing faces are moved toward each other by a defined path length.

In that regard, it is provided, in particular, that the method provides for storing or measuring of the distance between the pressing faces on placement of the pressing faces on the optical fibers and also for storing or measuring of the proportion of the free cross-sectional area between the pressing faces in the region of the optical fibers on placement of the pressing faces on the optical fibers, and that the path length is given by the product of the two stored or measured variables.

In one embodiment, it is provided that the pressing faces are moved toward each other by a high-precision drive, especially a piezo-based drive.

Advantageously, the determination of the height of the gap remaining between the pressing faces includes a referencing of the measuring device, either by the commencement of deformation of the optical fibers being detected, for example using a suitable sensor system, or by the pressing faces being moved on a regular basis, for example being moved at the beginning of a shift, so far toward each other that they touch.

Advantageously, following the detection of the commencement of deformation of the fibers, the pressing faces are moved toward each other for a defined path length, the path length being given by the distance between the pressing faces at the commencement of deformation of the fibers and the proportion of the free cross-sectional area between the pressing faces in the region of the fibers at the commencement of deformation of the fibers. It is possible for those two factors to be measured at the commencement of deformation of the fibers by a sensor system known per se; advantageously, however, the fibers are arranged in one layer and have a round cross-section of a known diameter. The distance is then given, at least approximately, by the product of the diameter of the fibers and the factor (1-pi/4).

Advantageously, one of the two pressing faces or both of the pressing faces is/are part of one or two fiber supports that form(s) a connection, especially an integral connection, to the optical fibers. In those cases, to improve the accuracy of the reshaping of the optical fibers it is advantageous to select the optical fibers and the fiber support(s) with regard to their materials as described above.

In addition or as an alternative, the second further aspect of the present invention is considered by proposing the production of a light source, especially a light source for optical excitation of a laser device, for example a laser device of a laser ignition system of an internal combustion engine, including a diode laser having a large number of emitters and a light-guiding device, the light-guiding device including a large number of optical fibers and each optical fiber having a first end and a lateral surface, the first ends being arranged relative to the emitters in such a manner that light generated by the emitters is coupled into the first ends of the optical fibers, the optical fibers being arranged in abutting relationship along their lateral surfaces at least in the region of their first ends, the production method having the following steps:
arranging a large number of optical fibers that form, in a sub-region, a fiber section disposed between two opposing pressing faces, the pressing tool including two parts and each of the two parts of the pressing tool including one of the pressing faces,
heating the fiber section,
deforming the heated optical fibers within the fiber section by a relative movement between the parts of the pressing tool,
ceasing of the relative movement between the parts of the pressing tool, the relative movement ceasing as a result of the two parts of the pressing tool abutting directly or indirectly.

In that regard, it is provided, in particular, that the optical fibers are arranged in abutting relationship along their lateral surfaces at least in the fiber section.

Advantageously, the abutting of the two parts of the pressing tool may take place directly, that is to say, by the parts of the pressing tool being in contact with each other. In that case, it is directly possible to reproduce a high dimensional accuracy of the tool in a defined, high-accuracy reshaping of the optical fibers.

Advantageously, the abutting of the two parts of the pressing tool may take place indirectly, through at least one spacer arranged between the pressing faces of the pressing tool. Such spacers may be manufactured and arranged with comparatively little effort, and therefore it is possible for optical fibers of various types, for example optical fibers of different cross-sections or optical fibers made from different materials, to be reshaped in a precise manner with one tool.

Advantageously, the parts of the pressing tool are of a shape and arrangement or the spacer is of a dimension and arrangement such that ceasing of the relative movement between the parts of the pressing tool takes place when the optical fibers first fill a region between the pressing faces at least to a large extent, especially when more than 95% or even more than 99.5% of a region between the pressing faces has been filled.

Advantageously, the optical fibers are arranged in one layer and the optical fibers have a round cross-section of a known diameter, and the parts of the pressing tool are of a shape and arrangement or the spacers are of a dimension and arrangement such that ceasing of the relative movement between the parts of the pressing tool takes place when the distance between the pressing faces of the pressing tool is at least approximately given by the product of the diameter of the optical fibers and the factor pi/4. In the cases mentioned, a light-guide element that is mechanically particularly stable results.

Advantageously, the abutting of the parts of the pressing tool takes place beside the region in which the optical fibers are arranged. In that manner, it is possible to obtain as close as possible an arrangement of the optical fibers.

Advantageously, one of the two pressing faces or both of the pressing faces is/are part of one or two fiber supports which form a connection, especially an integral connection, to the optical fibers as a result of the method of the present invention. In those cases, to improve the accuracy of the reshaping of the optical fibers it is advantageous to select the optical fibers and the fiber support(s) with regard to their materials as described above.

If a spacer is arranged between the pressing faces, to improve the accuracy of the reshaping of the optical fibers it is advantageous for the optical fibers to consist of one or more first types of glass and for the spacer to consist of one or more third types of glass, and for the softening temperature of the second type of glass or the softening temperatures of the third types of glass to have a higher value than the softening temperature of the first type of glass or the softening temperatures of the first types of glass. If the types of glass are selected accordingly, it is ensured that deformation of the fibers, but not of the spacer occurs. Preferably, the softening temperatures are more than 20K apart.

BRIEF DESCRIPTION OF THE DRAWINGS

FIG. 1 is a schematic illustration of an internal combustion engine having a laser ignition device.

FIG. 2 shows schematically a laser ignition device in detail.

FIGS. 10, 11, 12, 13 and 14 show further examples of the production of a light source.

FIGS. 19 and 20 show schematically by way of example a further production method for a light source.

DETAILED DESCRIPTION OF THE INVENTION

Figure 3A:
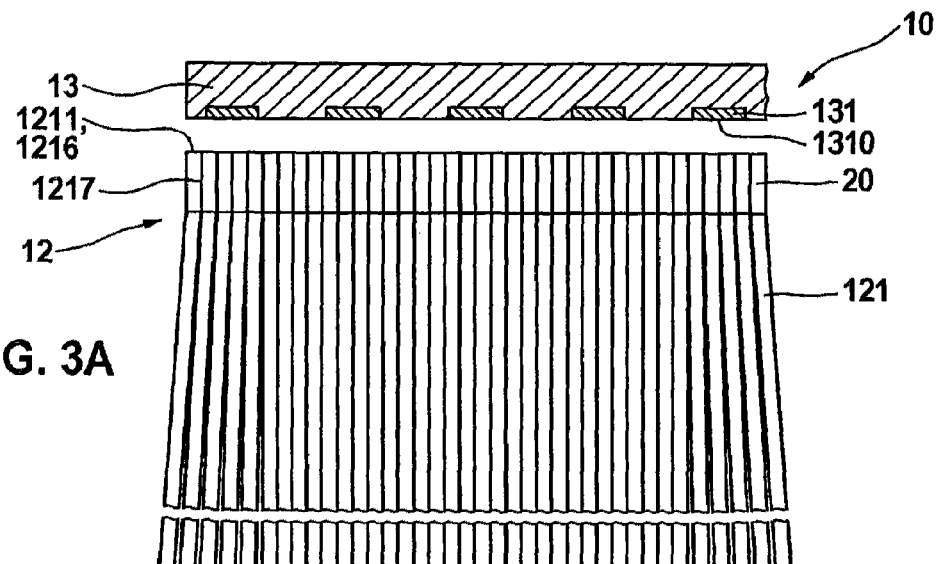
FIGS. 3a, 3b, 3c and 3d show schematically an example of a light source.

An internal combustion engine bears reference numeral 109 overall in FIG. 1. It is used to drive a motor vehicle, not shown, or a generator, also not shown. Internal combustion engine 109 includes a plurality of cylinders 129, one of which is shown in FIG. 1. A combustion chamber 14 of cylinder 129 is delimited by a piston 16. Fuel 229 passes into combustion chamber 14 directly through an injector 18 which is connected to a fuel pressure reservoir 209.

Fuel 229 injected into combustion chamber 14 is ignited by a laser pulse 24 radiated into combustion chamber 14 by an ignition device 27 that includes a laser device 11, and is focused by a focusing lens system 261. Laser device 11 is fed with a pump light from a light source 10 via a light-guiding device 12. Light source 10 is controlled by a control unit 32 which also activates injector 18.

Light source 10 includes, in addition to light-guiding device 12, also a diode laser 13 that, as a function of a control current, emits a corresponding pump light via light-guiding device 12 to laser device 11.

FIG. 2 shows schematically a detailed view of solid-state laser 260 of laser device 11 of FIG. 1. As will be seen from FIG. 2, solid-state laser 260 has a laser-active solid body, hereinafter referred to as laser crystal 44, with a crystal, the passive Q-switch 46, arranged optically downstream thereof. Solid-state laser 260 further includes an input mirror 42 and an output mirror 48. The components of solid-state laser 260 are of a monolithic construction in this example, that is to say, they are joined to one another largely inseparably, for example by bonding and/or coating.

To generate a laser pulse, also referred to as a giant pulse, laser crystal 44 is acted upon by pump light 28a through input mirror 42, with the result that optical pumping and the formation of a population inversion in laser crystal 44 take place. Initially, passive Q-switch 46 is in its resting state, in which it exhibits comparatively little transmission for the light that is to be generated by laser device 11. In that manner, the process of stimulated emission and hence the generation of laser radiation is initially suppressed. As the pumping duration increases, that is to say, while pump light 28a is being applied, the radiation intensity in solid-state laser 260 increases, however, with the result that passive Q-switch 46 is ultimately bleached. Thereupon, its transmission increases abruptly, and the generation of laser radiation commences. That state is symbolized by arrow 24'. During laser operation, owing to the effect of the stimulated emission the population inversion in laser crystal 44 rapidly decays, with the result that the emission of solid-state laser 260 typically ceases after a few nanoseconds, and subsequently the transmission of Q-switch 46 also sinks to its original, low value again.

In the manner described above, a laser pulse 24, also referred to as a giant pulse, having a relatively high peak output power is produced. Laser pulse 24 is coupled into combustion chamber 14 (FIG. 1) of internal combustion engine 109 through a combustion chamber window (not shown) of laser device 11, where applicable using a further light-guiding device (also not shown) or alternatively directly, with the result that fuel 229 or an air/fuel mixture present therein is ignited.

FIGS. 3a, 3b, 3c and 3d show a schematic view of an exemplary embodiment of a light source 10. Diode laser 13 included in light source 10 has the structural form of a so-called diode laser bar. It therefore has a large number of emitters 131 arranged one beside another. Emitters 131 have a lateral surface 1310 through which the light generated by emitters 131 emerges. That lateral surface 1310 is typically of an approximately rectangular shape with a short, for example 1 μm long, first side 1311, usually referred to as the fast axis, and a longer, for example 10-500 μm long, second side 1312, usually referred to as the slow axis. Between emitters 131, which are arranged one beside another in the direction of the slow axis in one layer plane, there are regions called separating trenches from which no light is emitted. The light generated by emitters 131 and emerging from lateral surfaces 1310 has in each case the shape of a light cone, with the half-cone angle of the light cone in the plane of the fast axis typically being in the range of from 30° to 60° and generally being markedly greater than the half-cone angle of the light cone in the plane of the slow axis, which is typically only a few degrees.

Although diode laser 13 has the structural form of a so-called diode laser bar in this example, the invention is not limited to such a structural form, but also includes, for example, diode lasers 13 with other arrangements of emitters 131, for example arrangements having emitters 131 in a plurality of layer planes, those layer planes being offset from one another by a few micrometers, for example, in the direction of the fast axis, for example so-called diode laser stacks or nanostacks.

Light-guiding device 12, which is also included in light source 10, has a large number of fibers 121, also referred to as optical fibers 121, fibers 121 each having a first end 1211 and a second end 1212. Fibers 121 are arranged, in the region of their first ends 1211, one beside another in one layer. Fibers 121 are further so arranged, in the region of their first ends 1211, that end faces 1216 of fibers 121 belonging to first ends 1211 lie together in one plane. Fibers 121 are further arranged, in the region of their first ends 1211, in abutting relationship along their lateral surfaces 1217, that is to say are so arranged that all fibers 121 or almost all fibers 121, for example more than 90% of fibers 121, are in contact with directly adjacent fibers 121 in the region of their first ends 1211.

In this example, end faces 1216 of fibers 121 are of a substantially rectangular shape, and similarly cross-sections of fibers 121 are of a substantially rectangular shape in the region of their first ends 1211. In this case, fibers 121 are in planar contact with one another, in the region of their first ends 1211, along approximately flat regions of lateral surfaces 1217 of fibers 121. It will be appreciated that the invention is not limited, however, to fibers 121 that are of substantially rectangular cross-sections in the region of their first ends 1211. Those cross-sections may also be trapezoidal or have curved sides, but it is preferred that fibers 121 be in planar contact with one another along their lateral surfaces 1217 in the region of their first ends 1211 and that end faces 1216 of fibers 121 lie together in one plane, end faces 1216 of fibers 121 lying as close as possible together, that is to say without inclusions of free surfaces.

End faces 1216 of fibers 121 and cross-sections of fibers 121 have an at least largely identical surface area, which is preferably between 3000 μm$^2$ and 5000 μm$^2$. Preferably, end faces 1216 of fibers 121 and cross-sections of fibers 121 lying in the region of first ends 1211 of fibers 121 have the shape of a rectangle whose side lengths form a ratio of approximately 0.78 or pi/4, fibers 121 being in contact preferably along the short sides of the rectangles. Cross-section of a fiber 121 is to be understood within the scope of this invention as meaning a cross-section perpendicular to longitudinal axis 1219 of fiber 121.

Fibers 121 consist of at least one type of glass, each individual fiber 121 preferably consisting of at least two different types of glass. Types of glass employed are, for example, types of so-called flint glass and/or soda-lime glass.

Figure 4:
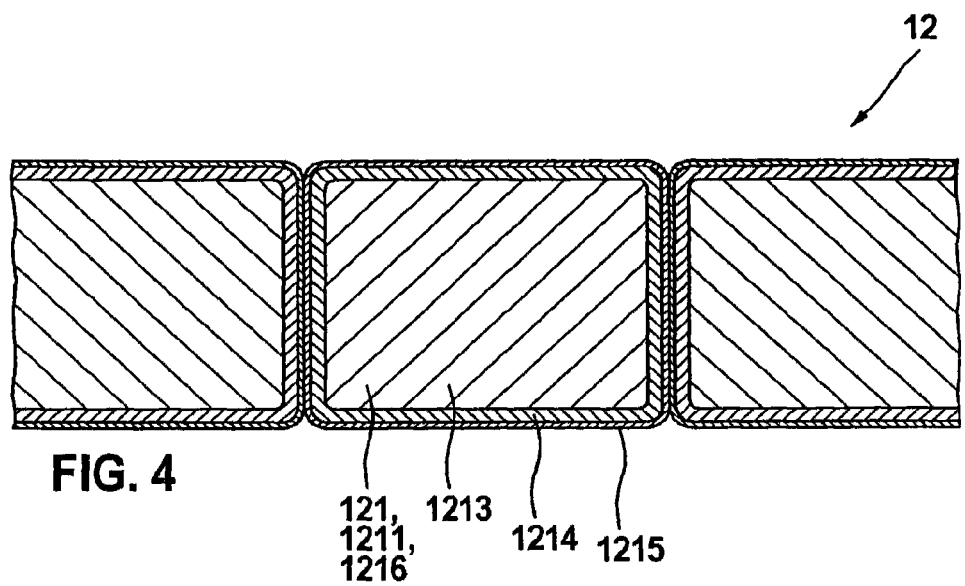
FIGS. 4, 4a show schematically the structure and arrangement of optical fibers.

FIG. 4 shows a detail of light-guiding device 12, especially of end faces 1216 belonging to first ends 1211 of fibers 121, which end faces 1216 represent cross-sections of fibers 121 in the region of their first ends 1211. Visible in cross-section, or along end face 1216, of a fiber 121 are a fiber core 1213 arranged centrally in fiber 121, and also a fiber cladding 1214 surrounding fiber core 1213 laterally, that is to say perpendicularly to longitudinal axis 1219 of fibers 121. Also visible in cross-section, or along end face 1216, of a fiber 121, there is a fiber coating 1215 laterally surrounding fiber cladding 1214. Both end face 1216 of fiber 121 and cross-sections of fibers 121 in the region of their first ends 1211 have in this example an almost rectangular shape. Similarly, in the region of first end 1211 of fibers 121, cross-sections of fiber core 1213 and of the structure formed by fiber core 1213 and fiber cladding 1214 and of the structure formed by fiber core 1213 and fiber cladding 1214 and fiber coating 1215 have almost rectangular cross-sections.

It is provided that the thickness of fiber cladding 1214, at least in the region of first ends 1211 of fibers 121, is small in comparison with the cross-sectional surface, especially in comparison with the square root of the surface area of the cross-sectional surface, of fiber core 1213, whereby a high proportion of the emission of diode laser 13 is coupled into fiber cores 1213 where it may be guided with little loss.

In order that the light that is nevertheless coupled into fiber cladding 1214 of fiber 121 is at least to some extent guided therein to second end 1212 of fiber 121, provision is made in addition or as an alternative for fiber core 1213 to consist of a first material, for fiber cladding 1214 to consist of a second material and for fiber coating 1215 to consist of a third material, the first material having a refractive index for the light generated by diode laser 13, whose wavelength is 808 nm for example, of $n_1$, the second material having a refractive index for the light generated by diode laser 13 of $n_2$, and the third material having a refractive index for the light generated by diode laser 13 of $n_3$, and where $n_1 > n_2 > n_3 > 1$.

In this example, fiber core 1213 has, in the region of first ends 1211 of fiber 121, an almost rectangular shape and side lengths of 60 μm and 77 μm, fiber cladding 1214 forms an approximately 2 μm thick layer and fiber coating 1215 an approximately 0.05 μm thick layer. The first material, the material of fiber core 1213, is a type of glass having a refractive index between 1.5 and 1.6, for example flint glass. The second material, the material of fiber cladding 1214, is a type of glass having a refractive index between 1.4 and 1.5, for example soda-lime glass. The third material, the material of fiber coating 1215, is a plastics material and has a refractive index between 1.15 and 1.35. Fiber coating 1215 additionally has the function of improving the durability of fibers 121. Fiber coating 1215 may be a covering of lacquer (acrylate or plastics material).

Figure 4A:
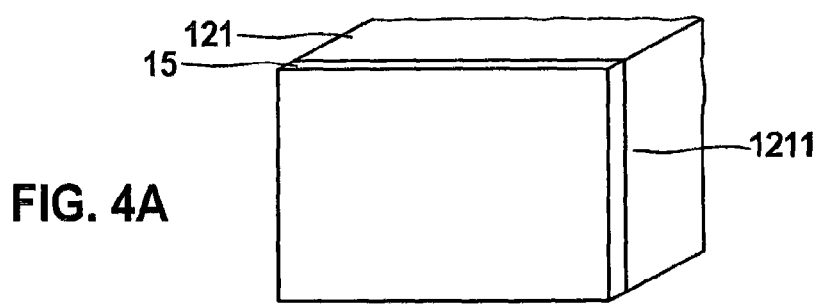

First ends 1211 and/or second ends 1212 of fibers 121 may have a polish and/or, as illustrated in FIG. 4a, an anti-reflection layer 15. Such a polish and/or such an anti-reflection layer 15 is so designed that it reduces optical losses on entry/exit into/from light-guiding device 12.

Figure 4B:
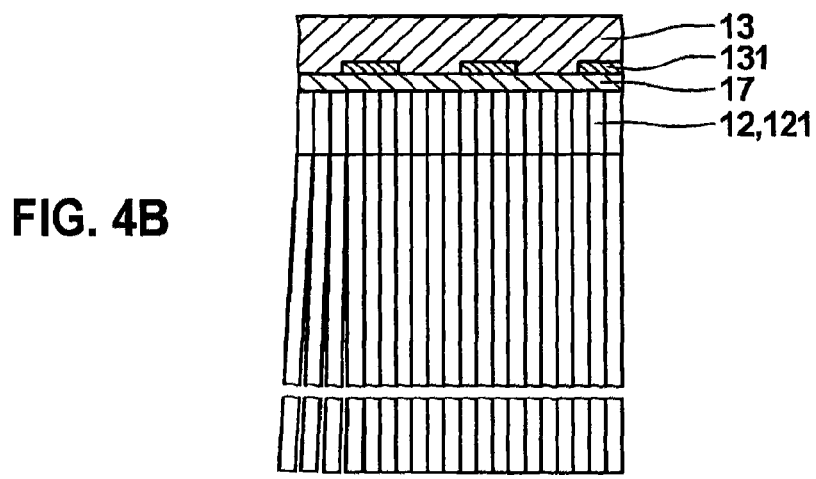
FIG. 4b shows schematically an example of the arrangement of light-guiding device and diode laser.

Alternatively or in addition, as illustrated schematically in FIG. 4b it is possible for a space between the first ends of fibers 1211 and emitters 131 of diode laser 13 to be completely filled with an optically homogeneous medium 17, for example an optical gel, preferably a gel that reduces optical losses on coupling of the light generated by emitters 131 of diode laser 13 into fibers 121 and/or that has a refractive index that is equal to or approximately equal to, for example not more than 15% different from, the refractive index of fiber core $n_1$.

Alternatively or in addition, it is possible for first ends 1211 of fibers 121 to be arranged in front of emitters 131 of diode laser 13 at a distance of from 1 μm to 10 μm.

Figure 3B:
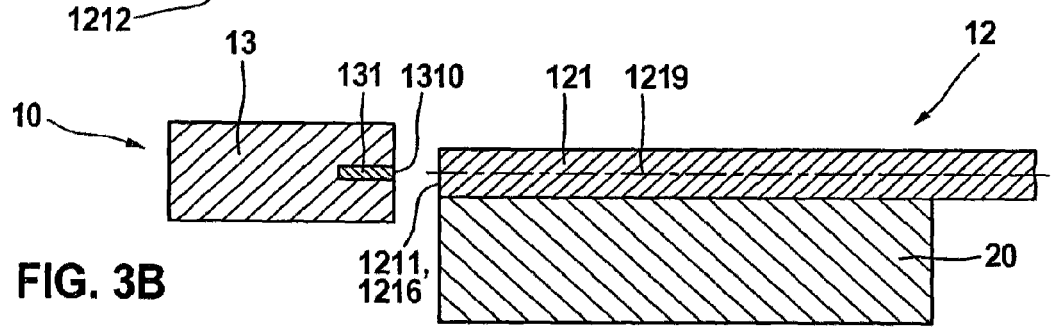
Figure 3C:
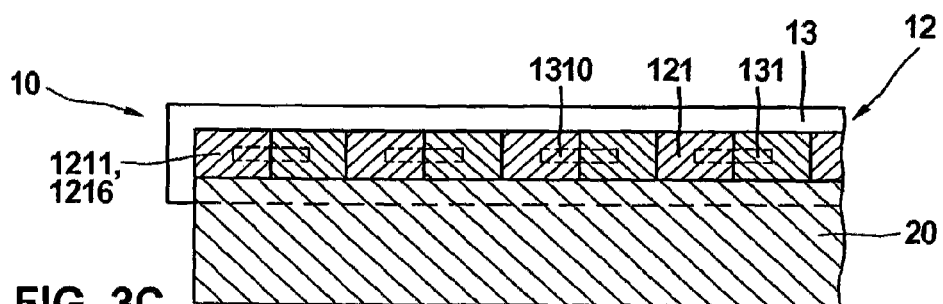
Figure 3D:
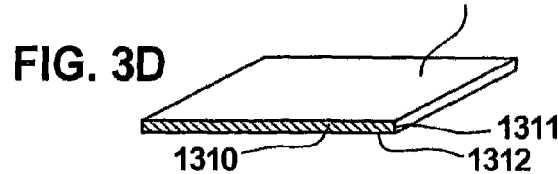

As will be seen in FIGS. 3a, 3b and 3c, in the region of their first ends 1211 fibers 121 are connected to a fiber support 20. Fiber support 20 used in this example has the shape of a cuboid plate, extends over the width in which fibers 121 are disposed, for example for about 20 mm, has a length oriented in the direction of longitudinal axes 1219 of fibers 121 of from 1 mm to 20 mm, for example up to 10 mm. On its side facing laser diode 13, fiber support 20 ends flush with end faces 1216 of fibers 121. The height of fiber support 20 is in the range of from a few tenths of a millimeter to a few millimeters and is typically many times greater than the height of fibers 121.

Fiber support 20 consists of a type of glass and is connected integrally to fibers 121 in the region of their first ends 1211. Fiber support 20 consists of a type of glass that, in comparison with the type or types of glass of which fibers 121 consist, has a lower hardness at room temperature, a comparable coefficient of thermal expansion and/or a higher softening temperature. Types of glass employed are, for example, float glasses.

The region referred to herein as the region of first ends 1211 of fibers 121 is to be regarded as that region of fibers 121 in which fibers 121 are disposed on fiber support 20.

The combination of fibers 121 and fiber support 20 is fixed relative to diode laser 13, for example by an adhesive bond. A further possibility is to make a fixture by using clamps so that it can be undone at a later date, for example for disassembly or readjustment purposes.

Figure 5A:
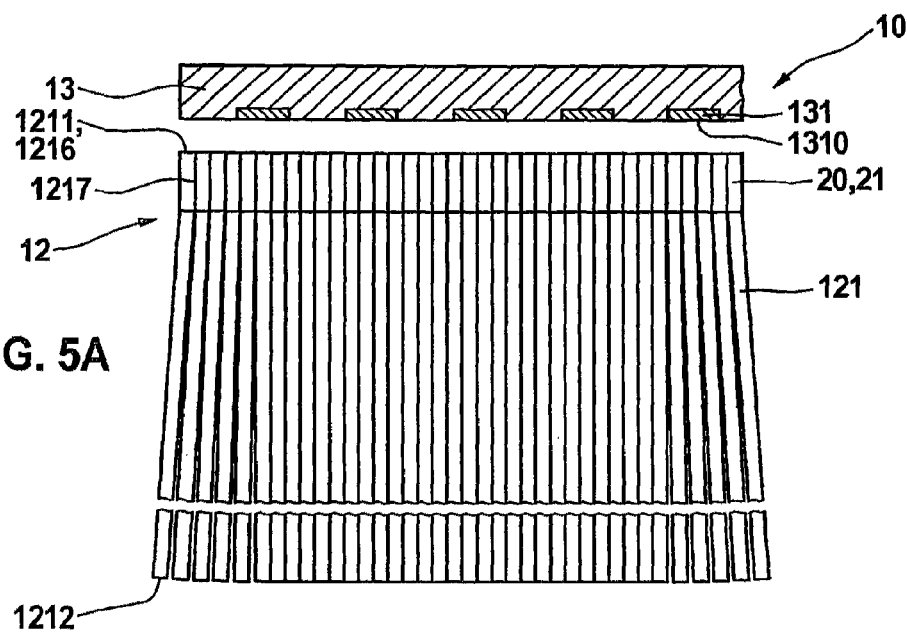
FIGS. 5a, 5b and 5c show schematically a further example of a light source.
Figure 5B:
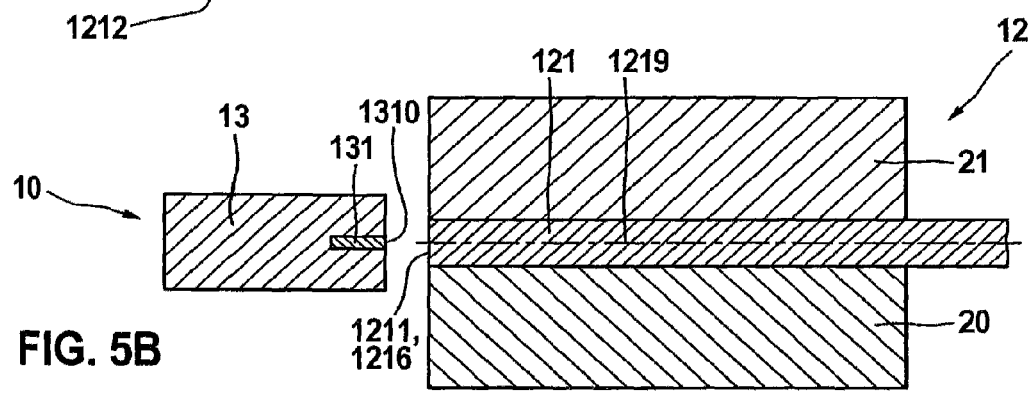
Figure 5C:
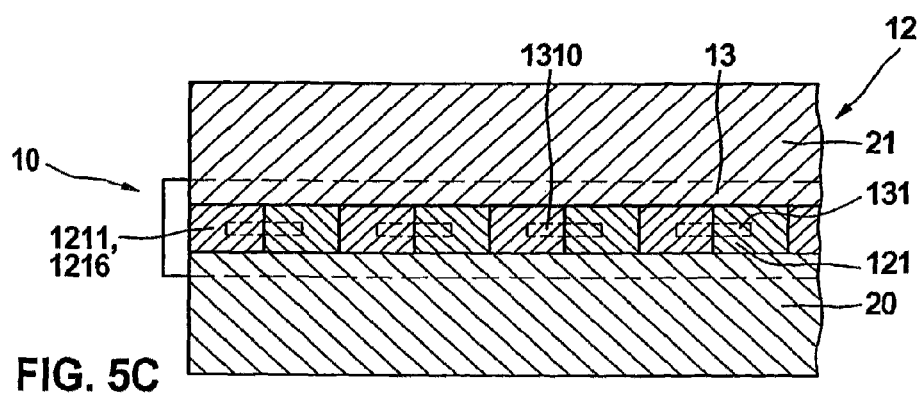

A further embodiment is illustrated in FIGS. 5a, 5b and 5c. That further embodiment differs from the embodiment illustrated in FIGS. 3a, 3b and 3c by the fact that, in the region of their first ends 1211, fibers 121 are not only disposed on a fiber support 20, but are disposed between fiber support 20 and a second fiber support 21. Fiber support 20 and second fiber support 21 each have the shape of a cuboid glass plate and are, for example, of the same size. For example, fiber support 20 and second fiber support 21 have the dimensions given in the previous example for fiber support 20.

Between fiber supports 20, 21 and fibers 121 there is an integral connection, and both fiber support 20 and fiber support 21 end flush with end faces 1216 of fibers 121.

On the one hand, it is possible for the surface of fiber support 20 facing fibers 121 and the surface of second fiber support 21 facing fibers 121 to be parallel to each other, so that the gap remaining between fiber supports 20, 21 has a uniform height. Alternatively, the surface of fiber support 20 facing fibers 121 and the surface of second fiber support 21 facing fibers 121 are tilted relative to each other in such a manner that the gap remaining between fiber supports 20, 21 has a lower height in the region of end faces 1216 of fibers 121 than in the opposite region of fiber supports 20, 21 from end faces 1216 of fibers 121. Preferably, tilting is effected by an angle of from 0.1° to 2.5°, for example from 0.2° to 0.5°.

In conformity with the shape of the gap between fiber supports 20, 21, a continuous tapering of fibers 121 is provided. By virtue of the continuous transition between a cross-sectional shape that is expedient for coupling into fibers 121 and a cross-sectional shape that is expedient for guiding light in fibers 121, abrupt transitions, which represent potential mechanical weak points, are avoided.

With regard to their material, the two fiber supports 20, 21 may have similar, and especially identical, properties. Preferably, second fiber support 21 consists of a type of glass that, in comparison with the type or types of glass of which fibers 121 consist, has a lower hardness at room temperature and/or a comparable coefficient of thermal expansion and/or a higher softening temperature.

Figure 6:
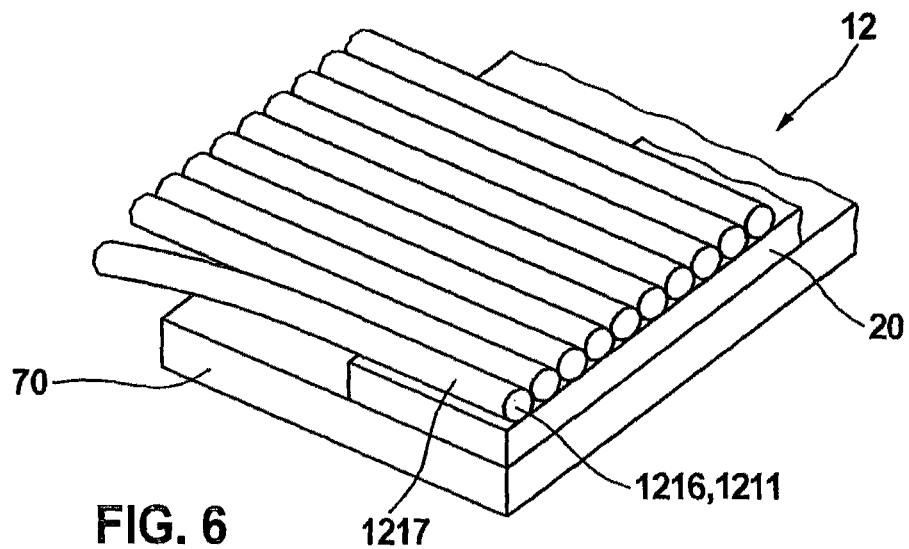
FIGS. 6, 7a, 7b, 7c, 7d, 7e, 7f, 7g, 7h and 7i show by way of example and schematically the production of a light source.

In the following, an example of the production of a light source 10 will be described with reference to FIG. 6. The starting point is a fiber support 20 having a height of 1 mm, a length of 5 mm and a width of 14 mm. Optical fibers 121 having round end faces 1216 and round cross-sectional surfaces and having a length of approximately 1000 mm and a diameter of approximately 70 µm are arranged over the entire width of fiber support 20, fibers 121 lying in one layer in the region of fiber support 20 and in abutting relationship along their lateral surfaces 1217, that is to say, all fibers 121 or almost all fibers 121, for example more than 90% of fibers 121, are in contact with directly adjacent fibers 121 along their lateral surface 1217 in the region of their first ends 1211. An arrangement of approximately 200 fibers 121 is thus obtained.

Fibers 121 are so aligned relative to one another and relative to fiber support 20, for example by using a common stop face (not shown), that end faces 1216 of fibers 121 end flush with one another and flush with fiber support 20.

Heating of fibers 121 arranged on fiber support 20 is carried out with a heating device 70, for example with an electrical resistance heater, for example to a temperature of from 550° C. to 800° C., the heat generated by heating device 70 reaching fibers 121 in the example through fiber support 20. As a result of fibers 121 and fiber support 20 being heated, the formation of an integral connection occurs between fibers 121 and fiber support 20.

Figure 7A:
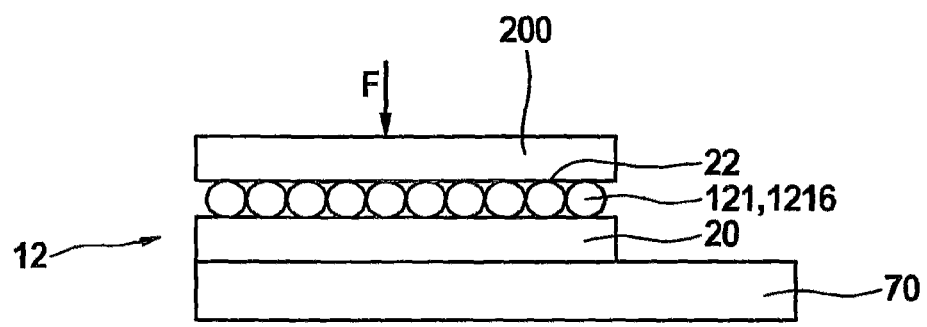
Figure 7B:
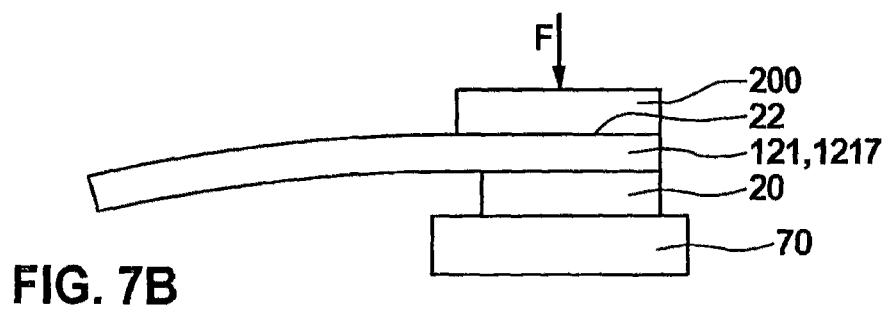

In an alternative embodiment of the method, as illustrated in FIGS. 7a and 7b the formation of a connection between fiber support 20 and fibers 121 is assisted and accelerated by bringing a counter-surface 22 of a tool 200 into contact with fibers 121 on the side of fibers 121 facing away from fiber support 20, under the action of a force F. A force is therefore also produced between fiber support 20 and fibers 121. To avoid the formation of a connection also between fibers 121 and counter-surface 22, the latter is to be made from at least one heat-resistant material that does not bond to glass even under the action of heat and pressure, for example SiC.

Figure 7C:
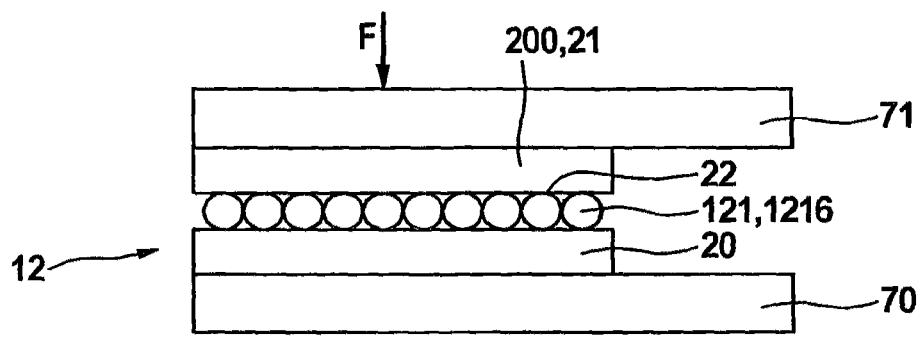
Figure 7D:
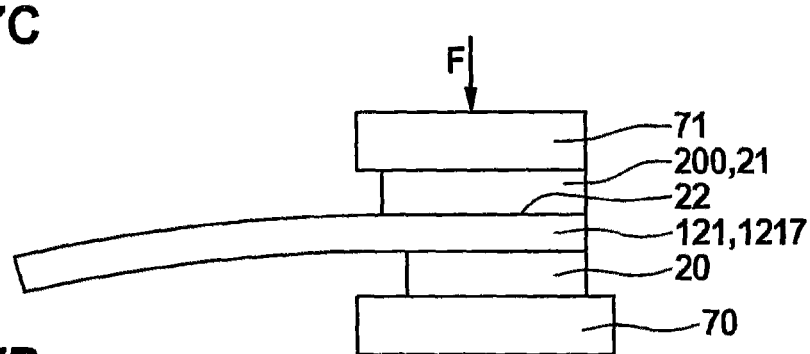

Alternatively, the formation of a connection between counter-surface 22 and fibers 121 may also be desirable, especially if, as shown in FIGS. 7c and 7d, the counter-surface is part of a second fiber support 21. In that case, it is possible to improve the supply of heat by using a second heating device 71, for example by using a second electrical resistance heater, arranged on that side of the combination of fibers 121 and fiber supports 20, 21 which faces away from first electrical resistance heater 70.

Figure 7E:
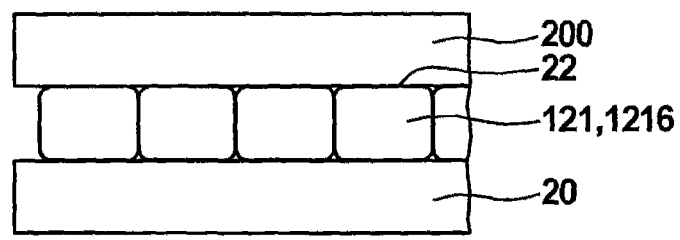
Figure 7F:
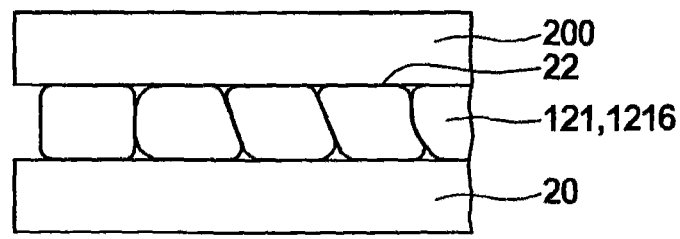

In an alternative embodiment of the method, the continued heating of fibers 121 is associated with a softening of fibers 121 and/or, under the action of the force applied by counter-surface 22, a deformation of fibers 121 occurs in the region of their first ends 1211. It will be observed in this case, as shown in FIG. 7e, that the initially round cross-sectional surfaces of fibers 121 have flattened in the regions in which fibers 121 are in contact with one another or with fiber support 20 or counter-surface 22, and therefore the curvature of lateral surfaces 1217 of fibers 121 decreases in those regions (increase in the radius of curvature) whereas the curvature increases in regions of lateral surfaces 1217 of fibers 121 that are still free (reduction in the radius of curvature). If the action of the heat and the force continues further, fibers 121 are further deformed in the region of their first ends 1211 until the space between fiber support 20 and counter-surface 22 is at least largely completely filled by fibers 121 (FIG. 7e). In the region of their first ends, fibers 121 then have, for example, rectangular cross-sections, especially with an aspect ratio of pi to 4, but on the other hand less regularly shaped cross-sectional surfaces of fibers 121, for example trapezoidal cross-sections or curved cross-sections, may also result (FIG. 7f).

Figure 7G:
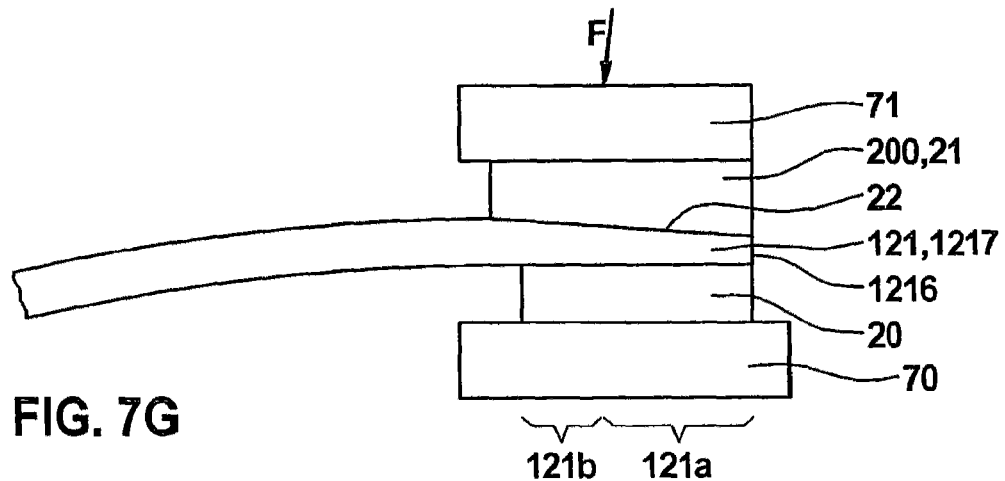
Figure 7H:
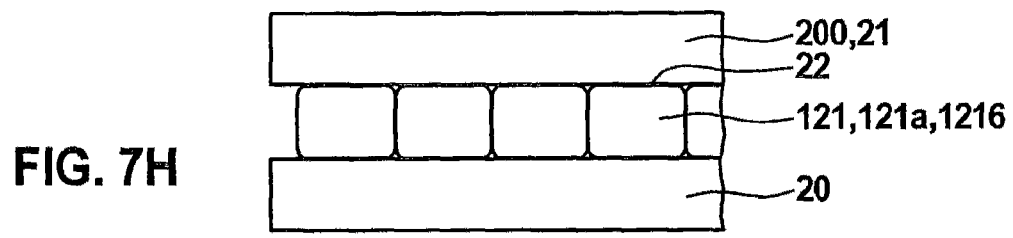
Figure 7I:
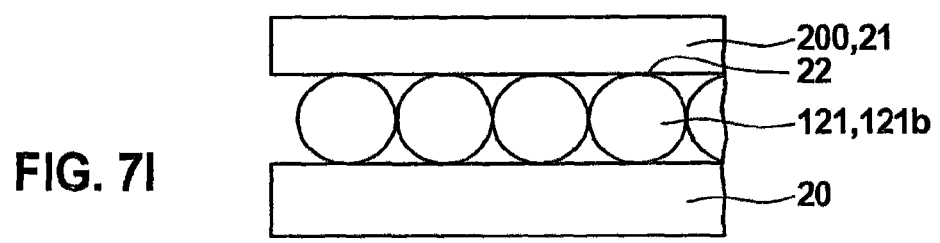

In another embodiment of the present invention, it is provided that, as can be seen in FIGS. 7g, 7h and 7i, fibers 121 are pressed to a greater extent in a first sub-region 121a, which includes end faces 1216 of fibers 121, than in a second sub-region 121b, second sub-region 121b being at a distance from end faces 1216 of fibers 121. For example, fibers 121 are pressed in first sub-region 121a to such a great extent that, following pressing, they have almost rectangular end faces 1216 (FIG. 7h). In this example, fibers 121 are pressed in second sub-region 121b to such a small extent that they retain an almost round cross-sectional surface in second sub-region 121b (FIG. 7i).

This is provided for by counter-surface 22 forming an angle of from 0.1° to 2.5° with respect to the contact surface of fibers 121 on fiber support 20. Alternatively or in addition, it is provided that the force acting on the fibers through counter-surface 22 forms an angle of from 0.1° to 2.5° with respect to the normal of the contact surface of fibers 121 on fiber support 20, so that an uneven pressing of fibers 121 results.

In the foregoing, the production of an individual light source 10, especially the production of an individual light-guiding device 12, has been described. As described by way of example hereafter, it is possible in addition or as an alternative to produce a plurality of light sources 10, especially a plurality of light-guiding devices 12, in one work step.

Figure 8A:
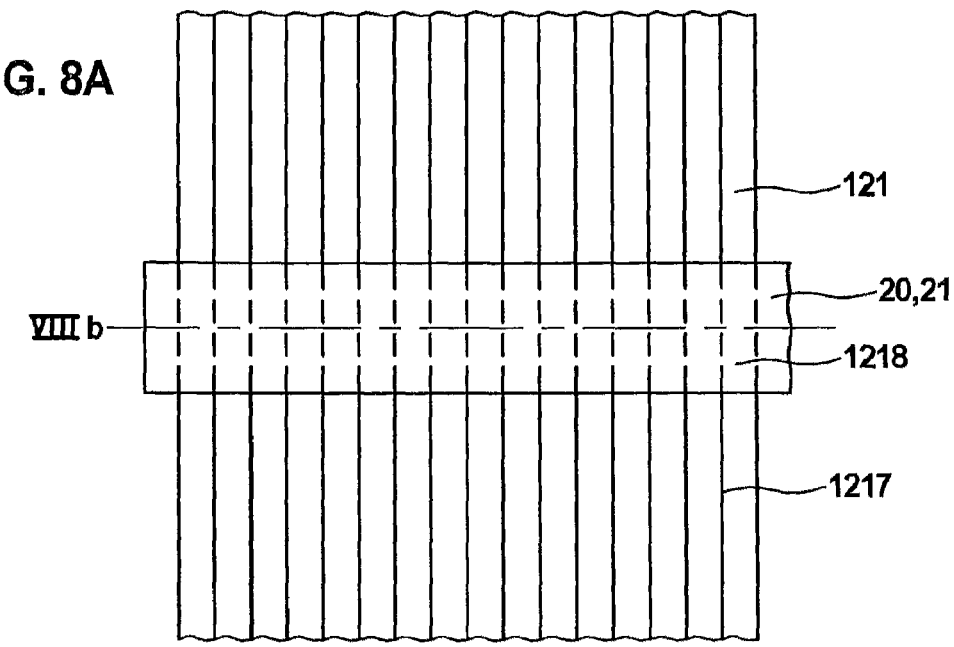
FIGS. 8a, 8b, 8c, 8d and 8e and FIGS. 9a and 9b show schematically a further example of the production of a light source.
Figure 8B:
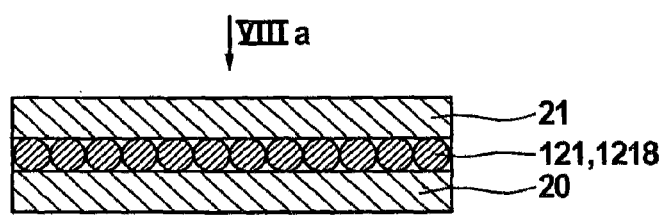

For this, for example, as illustrated in FIGS. 8a and 8b, a large number of fibers 121, especially a very large number of fibers 121, for example 1000 or more fibers 121, are arranged one beside another, so that fibers 121 are in abutting relationship along their lateral surface 1217 in a fiber section 1218, that is to say, are so arranged that all fibers 121 or almost all fibers 121, for example more than 90% of fibers 121, are in contact with directly adjacent fibers 121 along their lateral surfaces 1217 in fiber section 1218 in the region of their first ends 1211.

Fibers 121 are so arranged that fiber section 1218 lies at least approximately in the middle of fibers 121 in the longitudinal direction of fibers 121. Fibers 121 further lie in fiber section 1218 on a fiber support 20 which, for example, is a glass plate and has a height of approximately one millimeter, a length of a few millimeters and a width of from 50 mm to 200 mm or more. In this example, a second fiber support 21, whose characteristics in terms of geometry and material correspond to those of fiber support 20, is placed on fibers 121, opposite first fiber support 20.

Figure 8C:
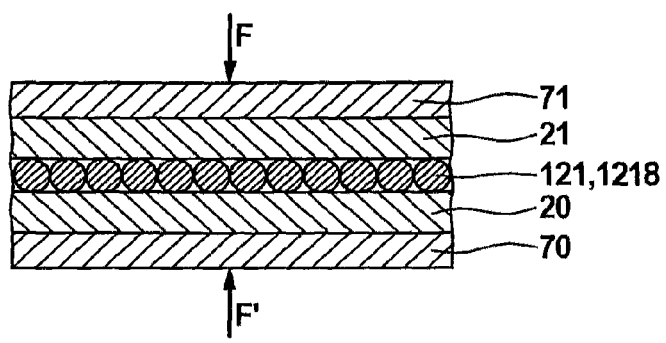

In FIG. 8c, the following method steps are illustrated schematically. These method steps include a heating of fiber support 20 and of fiber support 21 with two heating devices 70, 71 in the form of electrical resistance heaters. Indirectly, therefore, fibers 121 also are heated, in this example to from 550 to 850° C. These method steps further include the acting of a force F on fiber support 20 and the acting of a force F' on second fiber support 21. Forces F and F' are counter to each other and are so oriented that a pressure is exerted on fibers 121 via the two fiber supports 21, 22 collectively, for example a pressure of from 0.5 N/cm² to 50 N/cm².

Due to the action of the pressure, a deformation of fibers 121 occurs in the region between fiber support 20 and second fiber support 21, fibers 121 initially having round cross-sectional surfaces in the region between fiber support 20 and second fiber support 21 and those round cross-sectional surfaces deforming as described above owing to the deformation of fibers 121.

Figure 8D:
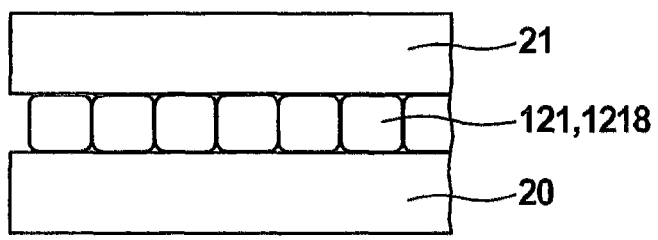
Figure 8E:
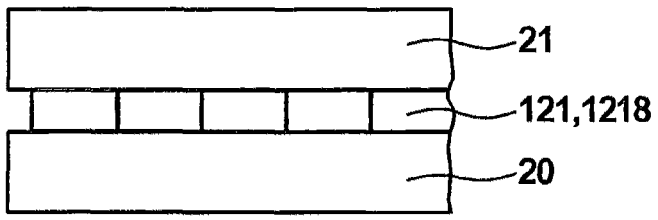

An example of correspondingly deformed fibers 121 is further shown in FIG. 8d, the cross-sectional surfaces of fibers 121 exhibiting flattening in the regions in which fibers 121 are in contact with fiber supports 20, 21 or with one another. FIG. 8e shows a further example in which fibers 121 largely fill the region between fiber support 20 and second fiber support 21, so that the totality of fibers 121 largely completely fills the space between the fiber supports. The cross-sections of individual fibers 121 in the region between fiber supports 20, 21 may be rectangular or trapezoidal.

Subsequently, cooling of fibers 121 and fiber supports 20, 21 takes place, during which solidification of fibers 121 occurs and an integral connection forms between fibers 121 and fiber supports 20, 21.

Figure 9A:
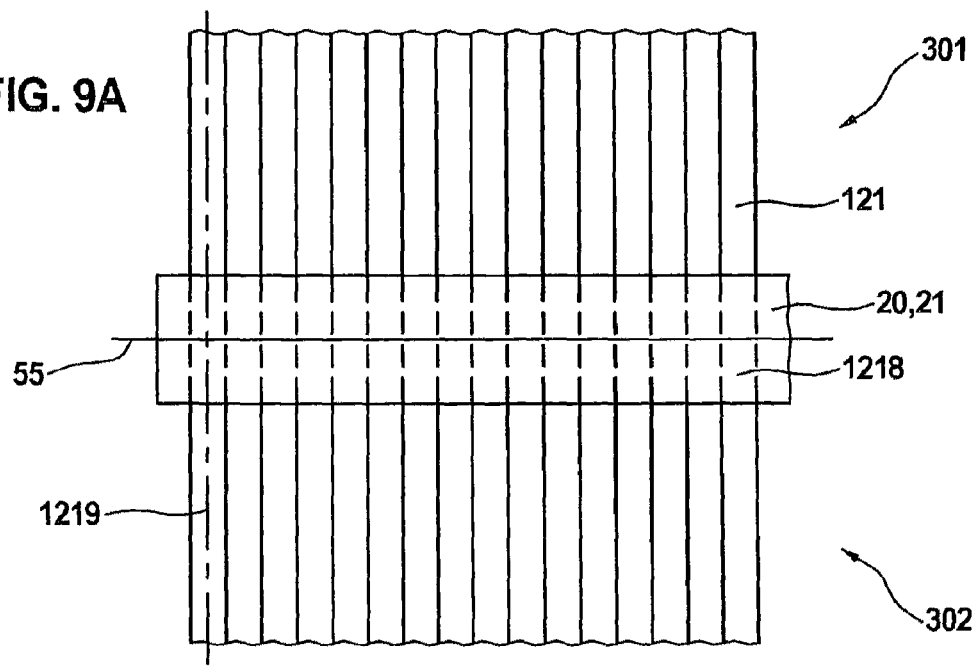

As illustrated schematically in FIG. 9a, in this example it is provided that the combination of fiber support 20, fibers 121 and second fiber support 21 is subsequently divided into two approximately equal parts 301, 302 by a cut 55 made approximately perpendicularly to longitudinal axes 1219 of fibers 121 in the region of fiber section 1218 of fibers 121. Cut 55 may be made, for example, in a manner known per se using a diamond saw or by scoring and breaking or with the aid of a laser beam, for example an infrared laser, especially a $CO_2$ laser.

It is optionally possible for the two parts 300, 301 so obtained or for a large number of parts 301, 302 so obtained to be stacked and collectively polished and/or collectively provided with an anti-reflection layer.

Parts 301, 302 obtained may be regarded as two light-guiding devices 12 that have been produced together.

Figure 9B:
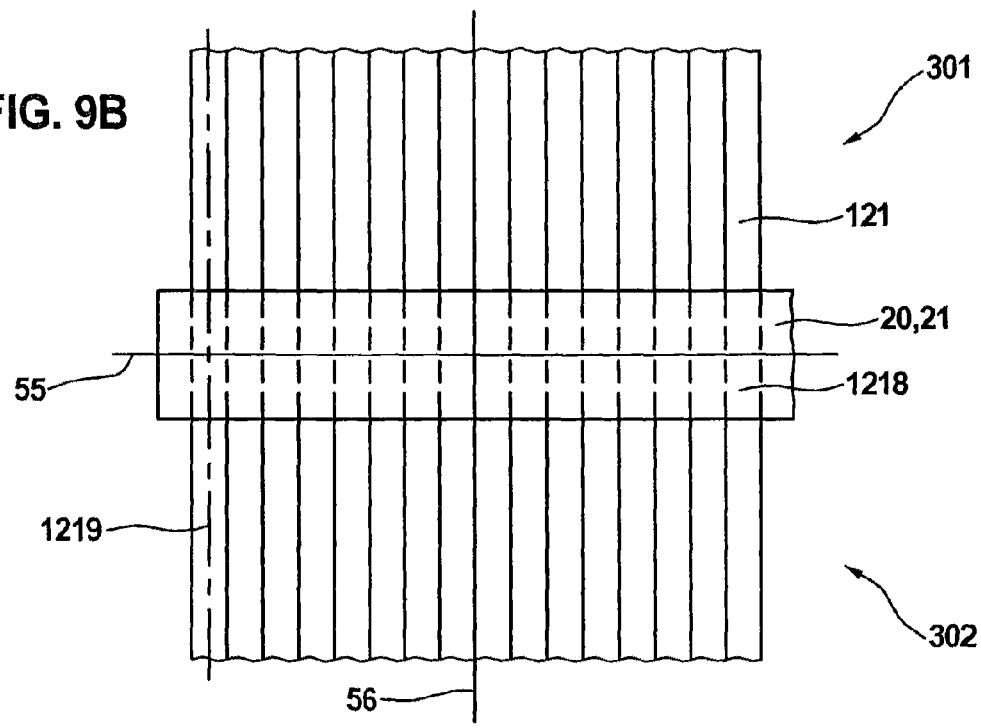

Furthermore, it is optionally also possible, as illustrated schematically in FIG. 9b, to further sub-divide parts 301, 302 individually or together by one or more second cuts 56 made along the longitudinal axes 1219 of fibers 121 in the region of fiber section 1218 of fibers 121 and in that manner produce a large number of light-guiding devices 12. Second cuts 56 may be made in a flexible manner, especially in such a manner that the widths of the light-guiding devices 12 produced correspond to the width of the diode lasers 13 with which they cooperate.

Second cuts 56 may be made in the same manner as cuts 55, for example using a diamond saw or by scoring and breaking or with the aid of a laser beam, for example an infrared laser, especially a $CO_2$ laser.

In particular, to make second cuts 56 it is possible to stack parts 301, 302 or a large number of parts 301, 302, so that a large number of individual light-guiding devices 12 is produced with every second cut 56.

As explained above, the production of a light source 10 may provide that, under the action of a force F on the heated fibers 121 in the region of first ends 1211 of fibers 121 or in a fiber section 1218 of fibers 121, for example in a fiber section 1218 approximately in the middle of fibers 121, a deformation of the heated fibers 121 occurs, for example such that the totality of the deformed fibers 121 completely fills a region between a fiber support 20 and a second fiber support 21. It will be appreciated that it is also possible for fiber support 20 and/or second fiber support 21 to be replaced by a tool 200, for example made of SiC, that does not bond to fibers 121 and that is removed following deformation of fibers 121. What is important is that, as illustrated in FIG. 10, fibers 121 are disposed between two pressing faces 201, 202 through which force F and counter-force F' act on fibers 121. In that case, the device produced does not have two fiber supports 21, 22, but has at most one fiber support 21. It is especially preferred in that case that first and/or second cuts 55, 56 be made by scoring and breaking.

In the example that follows, forces F and F' are so selected that deformation of fibers 121 takes place, but that deformation ceases when fibers 121 first fill a region between pressing faces 201, 202 at least to a large extent (for example >99.5% of the cross-section). That avoids both too low a force F, which would not be sufficient to deform fibers 121, and too high a force, which would lead to fibers 121 escaping sideways out of the region between pressing faces 201, 202.

In practice, 140 fibers made of flint glass/soda-lime glass were arranged between two pressing faces 201, 202 having a size of 15 mm*8 mm and were heated to approximately 630° C., that is to say above the softening temperature of fibers 121. Fibers 121 were then acted upon by a force F. The desired behavior was observed for forces between 1 N and 35 N.

It will be appreciated that it is possible within certain limits to heat fibers 121 to a higher or lower temperature, which results in an increased or reduced flowability of fibers 121. The range of force F in which the behavior occurs whereby deformation of fibers 121 takes place, but that deformation ceases when fibers 121 first fill a region between pressing faces 201, 202 at least to a large extent (for example >99.5% of the cross-section) is shifted in that case and may be found by experiment. In the example under consideration, the desired behavior was obtained for forces F between 10 N and 20 N and fiber temperatures between 590° C. and 690° C.

In another embodiment, it is provided in addition or as an alternative that the height of the gap remaining between pressing faces 201, 202 is determined, and the application of force F is brought to an end when the value determined reaches or exceeds a predefined value, that is to say when the height of the gap remaining between pressing faces 201, 202 reaches or exceeds a predefined height.

On the one hand, the application of force may be brought to an end when fibers 121 fill a region between pressing faces 201, 202 at least to a large extent (for example >99% of the cross-sectional surface) or, on the other hand, a different height may also be selected. In the embodiment shown in FIG. 11, fibers 121 having an initially round cross-section and a diameter D, which in this example is 100 μm, are laid in one layer and in abutting relationship along lateral surfaces 1217 of fibers 121 between two pressing faces 201, 202. Pressing faces 201, 202 are each either part of a fiber support 20, 21, which bonds to fibers 121, or part of a tool 200, for example made of SiC, which does not form any connection to fibers 121.

Pressing faces 201, 202 are movable by actuators, for example piezo actuators in this case, the movement of pressing faces 201, 202 being triggered by a signal applied to actuators 60, for example by a voltage. It is provided that the actual distance of pressing faces 201, 202 from each other is detected, for example on the basis of the signals applied to the actuators or by an optical system.

In this example, the position of pressing faces 201, 202 relative to each other before application of a voltage to the piezo actuator is referenced by bringing pressing faces 201, 202 into contact with not yet softened fibers 121. Subsequently, the voltage applied to the piezo actuators is increased in steps or continuously until the applied voltage corresponds to an elongation of the piezo actuators of 22 μm. At that time, the space between pressing faces 201, 203 is filled at least largely completely by deformed fibers 121.

Figure 12:
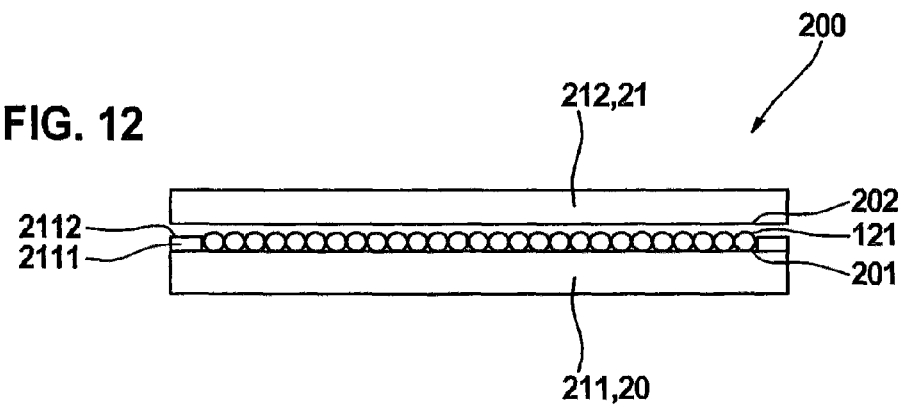

In alternative embodiments, it is provided that the height of the gap remaining between pressing faces 201, 202 is given by the pressing operation being performed by a pressing tool 200 that consists of two parts 211, 212, the first pressing face 201 being associated with first part 211 of pressing tool 200 and the second pressing face 202 being associated with second part 212 of pressing tool 200. As shown in FIG. 12, in this case first part 211 of pressing tool 200 has a projection 2111 in its outer regions. Projection 2111 is of a shape and arrangement such that it has a stop face 2112 which is level relative to second pressing face 202. For defined deformation of heated fibers 121 it is provided that the two parts 211, 212 of pressing tool 200 are moved toward each other until stop face 2112 of projection 2111 of first part 211 of pressing tool 200 comes into contact with second pressing face 202. The gap remaining between pressing faces 201, 202 is thus defined by the solid measure provided by projection 2111.

Figure 13:
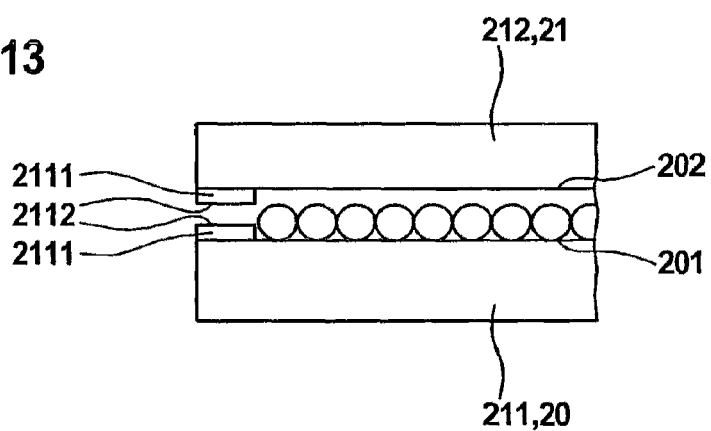

It will be appreciated that it is possible, as an alternative, or, as shown in FIG. 13, in addition, for second part 212 of pressing tool 200 to have a projection 2111 in its outer regions. In particular, it is possible for both parts 211, 212 of pressing tool 200 to have projections 2111, for example in their outer regions, projections 2111 having stop faces 2112 that are parallel to one another. In this case, for defined deformation of heated fibers 121 it is provided that the two parts of pressing tool 201, 202 are brought toward each other until stop faces 2112 of projections 2111 of first part 211 and of second part 212 of pressing tool 200 come into contact with each other. The gap remaining between pressing faces 201, 202 is thus defined by the solid measure provided by projections 2111.

The parts referred to above as first part 211 and second part 212 of pressing tool 200 may on the one hand both be tools in the narrow sense of the word, for example made of SiC, which do not form a connection to fibers 121 even under the action of heat and pressure, for example at temperatures up to 800° C. and pressures up to 50 N/cm². On the other hand, it is possible, as indicated in FIGS. 12 and 13 by the use of reference numerals 20 and 21, for first part 211 of pressing tool 200 to be a fiber support 20 and/or for second part 212 of pressing tool 200 to be a second fiber support 21, with fiber support 20 and/or second fiber support 21 preferably consisting of a type of glass and forming an integral connection to fibers 121 under the action of heat and pressure.

In a further example, it is provided that the height of the gap remaining between pressing faces 201, 202 is given by the pressing being performed by a pressing tool 200 that consists of two parts 211, 212, with first pressing face 201 being associated with first part 211 of pressing tool 200 and second pressing face 202 being associated with second part 212 of pressing tool 200 and with a spacer 40 or a plurality of spacers 40 being arranged between pressing faces 201, 202, for example in an outer region of pressing tool 200.

Figure 14:
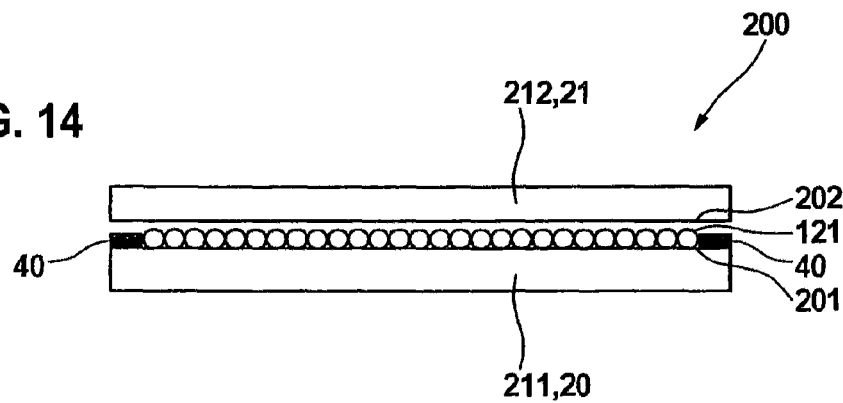

In the configuration of this example shown in FIG. 14, a spacer 40 is arranged on both sides of fibers 121. Spacers 40 are of a height corresponding to the height of the gap that is to remain between pressing faces 201, 202. Spacers 40 either consist of a material that does not form a connection to fibers 121 even under the action of heat and pressure, for example at temperatures up to 800° C. and pressures up to 50 N/cm², or spacers 40 consist of a type of glass and form an integral connection to fibers 121 under the action of heat and pressure.

For defined deformation of heated fibers 121 it is provided that the two parts of pressing tool 211, 212 are brought toward each other until spacers 40 come into contact with both pressing faces 201, 202. The gap remaining between pressing faces 201, 202 is thus defined by the solid measure provided by spacers 40.

As in the previous example, first part 211 and second part 212 of pressing tool 200 may be tools in the narrow sense of the word, for example made of SiC, which do not form a connection to fibers 121 even under the action of heat and pressure, for example at temperatures up to 800° C. and pressures up to 50 N/cm². On the other hand, it is possible for first part 211 of pressing tool 200 to be a fiber support 20 and/or for second part 212 of pressing tool 200 to be a second fiber support 21, with fiber support 20 and/or second fiber support 21 preferably consisting of a type of glass and forming an integral connection to fibers 121, and optionally also to spacers 40, under the action of heat and pressure. Deformation of spacers 40 is preferably avoided.

FIGS. 19 and 20 show a further exemplary embodiment of a light source 10 which includes a diode laser 13 and a light-guiding device 12. As in the previous examples, diode laser 13 and light-guiding device 12 cooperate in such a manner that diode laser 13 includes a large number of emitters 131 arranged one beside another, opposite which a large number of fibers 121 is arranged into which emission 135 of emitters 131 of diode laser 13 is coupled.

The disposition of emitters 131 and fibers 121 and the spatial characteristics of emission 135 of emitters 131 of diode laser 13 have the result that some of emission 135 of emitters 131 is coupled into some of fibers 121, but little or no light is coupled into others. It is provided that those fibers 121 into which little or no light is coupled are severed, preferably in the vicinity of fiber support 20, using a cutting device in the form of a notched cutter 65. The severing of fibers 121 with notched cutter 65 may be carried out, in particular, at that edge of fiber support 20 at which fibers 121 project beyond fiber support 20. Notched cutter 65 has cutting elements 65a of width A, width A being identical to or almost identical to the width of the gaps between emitters 131 of diode laser 13. The spacing P of cutting elements 65a from one another is identical to or almost identical to the spacing P of emitters 131 from one another. Almost identical is used herein to mean a deviation corresponding at most to the spatial expansion of emission 135 of emitters 131 between the exit faces of emitters 131 and end faces 1216 of fibers 121 in the slow axis.

The severing of fibers 121 with notched cutter 65 is preferably carried out by positioning notched cutter 65 in a first step in front of diode laser 13 in such a manner that cutting elements 65a pass between emitters 131 of diode laser 13. That may be achieved by virtue of emitters 131 of diode laser 13 emitting light and by the quantity of light radiated through notched cutter being maximized as regards lateral displacement of notched cutter 65. Then, notched cutter 65 is raised, light-guiding device 12 is positioned in front of diode laser 13 and finally fibers 121 showing no illumination or only little illumination are severed by lowering notched cutter 65.

Figure 15:
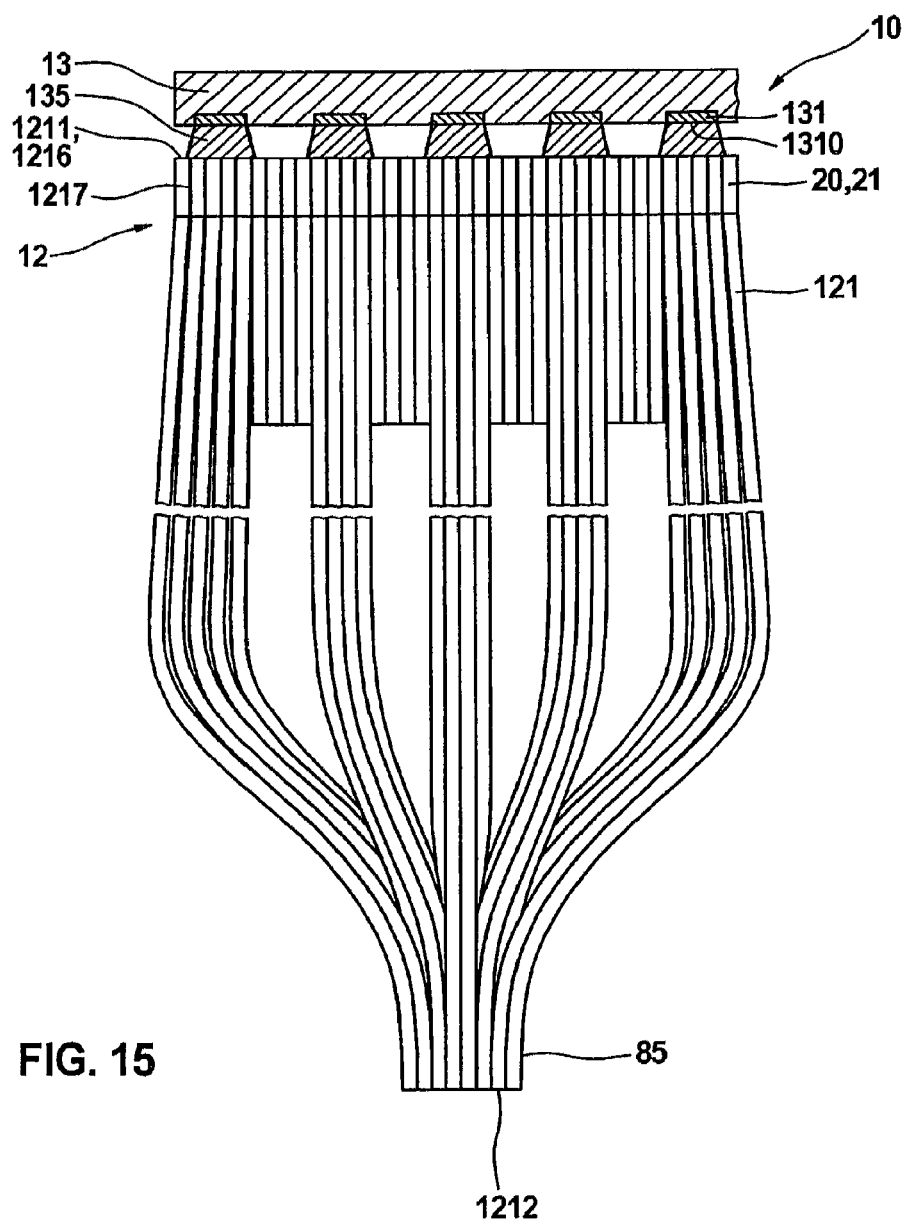
FIGS. 15, 15a and 15b, and 16 show schematically further examples of a light source.
Figure 15A:
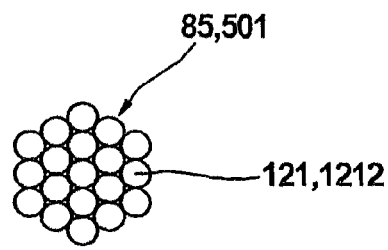
Figure 15B:
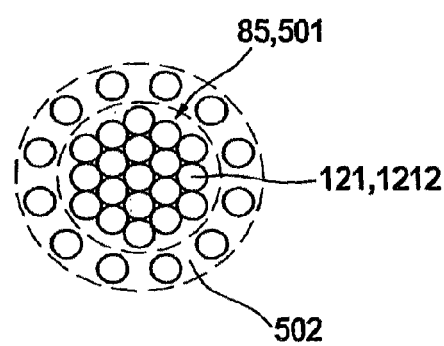

FIGS. 15, 15a and 15b show a further exemplary embodiment of a light source 10 including a diode laser 13 and a light-guiding device 12 which cooperate as in the previous example. The disposition of emitters 131 and fibers 121 and the spatial characteristics of emission 135 of emitters 131 of diode laser 13 result in different amounts of emission 135 of emitters 131 of diode laser, and hence in different amounts of optical radiation, being coupled into fibers 121. Virtually no radiation is coupled into fibers 121 that are arranged in regions opposite gaps between emitters 131. Approximately the same amount of radiation, radiation of radiation power $P_1$, is coupled into fibers 121 that are arranged in more centrally opposite relationship to emitters 131. Radiation of a radiation power between zero and $P_1$ is coupled into fibers 121 that lie opposite edge regions of emitters 131.

Figure 16:
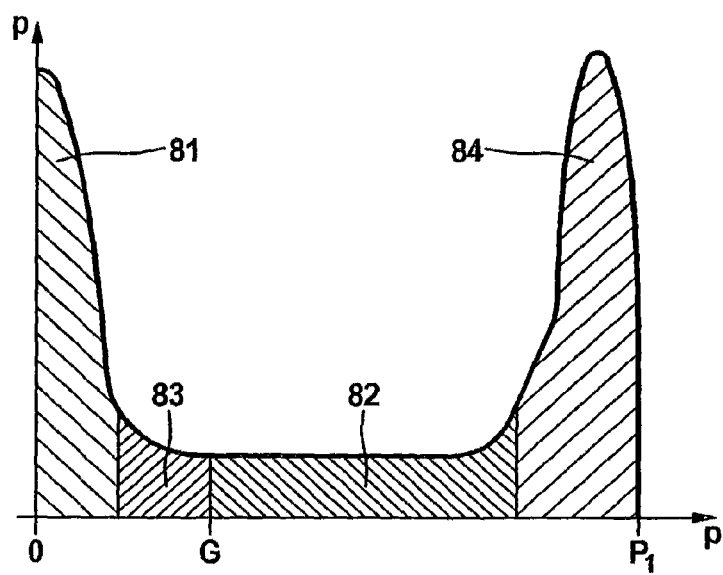

The resulting frequency distribution p of radiation power P coupled into fibers 121 is illustrated in FIG. 16. It will be seen that, in addition to a first group 84 of fibers 121, into which approximately radiation power $P_1$ is coupled, and a second group 81 of fibers 121, into which no radiation power or almost no radiation power is coupled, there is a third group 83 of fibers 121, into which radiation of a radiation power between zero and a limit value G is coupled. There is also a fourth group 82 of fibers 121, into which radiation of a radiation power lying between limit value G and $P_1$ is coupled.

It is provided that fibers 121 of first and fourth group 82, 84 form a first fraction 501 (FIG. 15*a*) of optical fibers 121 and are gathered together in the region of their second ends 1212 to form a bundle 85, in particular are joined to one another and/or compacted under the action of pressure and heat.

FIG. 15*b* illustrates schematically a further embodiment, in which fibers 121 of a second fraction 502 of fibers 121, into which fibers 121 less light is coupled than into fibers 121 of first fraction 501, are arranged around bundle 85.

Such a light source 10 may be produced, for example, by arranging a light-guiding device 12 of the kind discussed in the foregoing in front of a diode laser 13. By applying an operating current to diode laser 13, diode laser 13 is excited in the region of emitters 131 into emission of light. That light is coupled predominantly into fibers 121 of light-guiding device 12, a radiation of radiation power P being coupled into each individual fiber 121. It is provided that that radiation power is detected for each individual fiber 121.

Figure 17A:
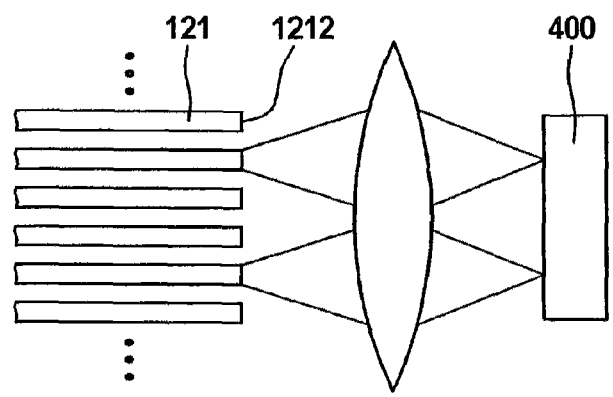
FIGS. 17a, 17b and 18 show schematically by way of example a production method for a light source.
Figure 17B:
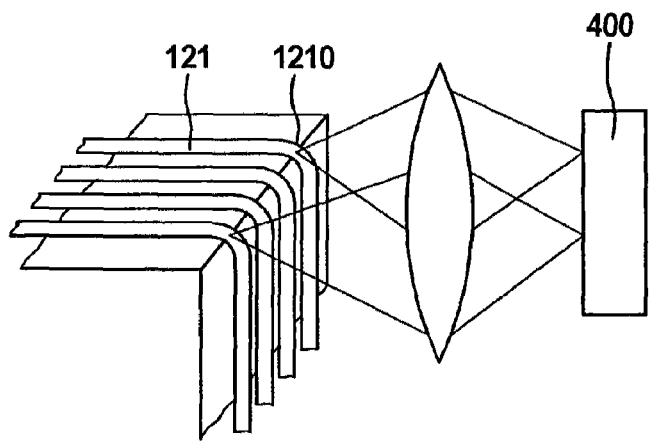

As shown in FIG. 17*a*, detection of the radiation powers is carried out, for example, by projecting an image of second ends 1212 of the fibers onto a CCD camera 400. On the other hand, it is possible, as shown in FIG. 17*b*, to subject fibers 121 to a bend 1210 so that a greater quantity of stray radiation escapes from them, and project that stray radiation onto a CCD camera 400.

Figure 18:
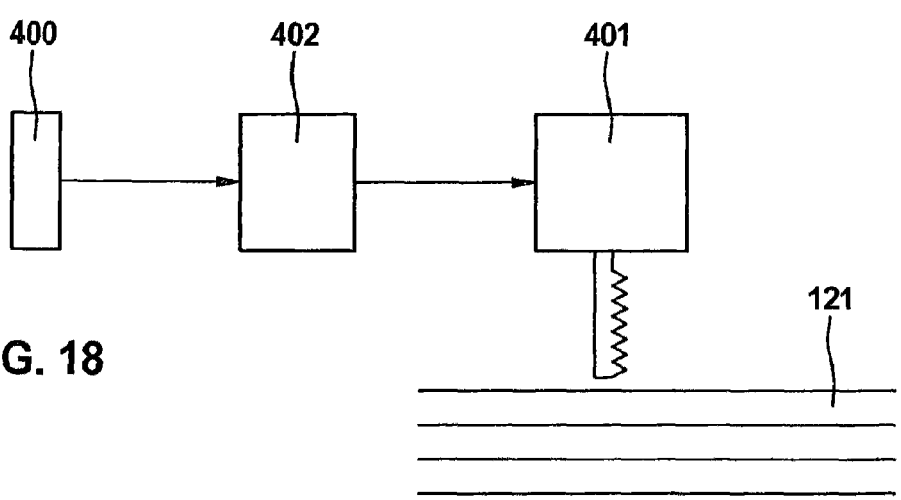

It is provided that, as illustrated schematically in FIG. 18, the images taken by CCD camera 400 are passed to a control unit 402. Control unit 402 decides whether radiation power P of the radiation guided in an individual fiber 121 is above or below limit value G. It is further provided that control unit 402 activates a cutting device 401, for example a $CO_2$ laser system, in such a manner that fibers 121 for which it has been decided that the radiation power of the radiation guided therein is below limit value G are severed.

It is provided that the remaining fibers 121, that is, fibers 121 for which it has been decided that the radiation power of the radiation guided therein is above limit value G are gathered together in the region of second ends 1212 of fibers 121 to form a bundle 85. It is optionally possible for fibers 121 that have been gathered together in the region of second ends 1212 to be compacted and/or integrally connected to one another in the region of their second ends 1212 by the action of pressure and heat.

It is provided that the radiation emerging from fibers 121 that have been gathered together to form a bundle 85 is used to optically excite a solid-state laser 260 (FIG. 2) whose emission is used to generate an ignition spark for igniting combustion in an internal combustion engine 109 (FIG. 1). Against that background it becomes clear that it is advantageous to select limit value G in such a manner as to optimize a feature of the combustion in internal combustion engine 109, especially performance, emission values, number of ignition failures or the like. On the other hand, limit value G may also be selected in such a manner as to optimize at least one property of the emission of solid-state laser 260, especially output power of solid-state laser 260, beam quality or power density per surface area per solid angle of solid-state laser 260.

What is claimed is:

1. A light source for optical excitation of a laser device, comprising:
    a diode laser having a plurality of emitters; and
    a light-guiding device including a plurality of optical fibers each having a first end and a lateral surface, the first ends being situated relative to the emitters in such a manner that light generated by the emitters is coupled into the first ends of the optical fibers, wherein the optical fibers are arranged in abutting relationship along the lateral surfaces at least in the region of the first ends, and wherein the optical fibers are connected in the region of the first ends to a fiber support;
    wherein the fibers include at least one first type of glass and the fiber support includes at least one second type of glass, and wherein the softening temperature of the second type of glass is higher than the softening temperature of the first type of glass.

2. The light source as recited in claim 1, wherein the fiber support is connected in the region of the first ends of the optical fibers to the lateral surfaces of the optical fibers.

3. The light source as recited in claim 1, wherein the optical fibers are integrally connected to the fiber support.

4. The light source as recited in claim 1, wherein the fiber support ends flush with the optical fibers in the longitudinal direction of the optical fibers.

5. The light source as recited in claim 1, wherein the light-guiding device includes two fiber supports, and wherein the region of the first ends of the optical fibers are disposed between the two fiber supports.

6. The light source as recited in claim 5, wherein at least one of: (i) the optical fibers are integrally connected to the two fiber supports; and (ii) the two fiber supports end flush with each other and with the optical fibers in the longitudinal direction of the optical fibers.

7. The light source as recited in claim 1, wherein the softening temperature of the second type of glass has a value from 20 to 250 K.

8. The light source as recited in claim 1, wherein at least in the area of the first ends, the fibers each have a greater radius of curvature in cross-section in at least one of (i) the region in which the fibers are in contact with one another and (ii) the region in which the fibers are in contact with the fiber support, than in the region in which the fibers are neither in contact with one another nor in contact with the fiber support.

9. The light source as recited in claim 8, wherein at least in the area of the first ends, the fibers have a substantially rectangular cross-section with an aspect ratio of approximately pi to 4.

10. The light source as recited in claim 1, wherein the fibers each have within the region of the first end a first sub-region and a second sub-region, and wherein the first sub-region is toward the end face of the first end of the respective fiber, and wherein the second sub-region is at a distance from the end face of the first end, and wherein a cross-sectional surface in the first sub-region deviates from a round surface to a greater extent than does a cross-sectional surface in the second sub-region of the respective fiber.

11. The light source as recited in claim 10, wherein the end faces of the fibers have one of a trapezoidal or rectangular cross-section, and wherein the cross-sectional surfaces of the fibers within the region of the first ends of the fibers change to a round cross-section along the longitudinal axes of the fibers.

12. The light source as recited in claim 1, wherein the cross-sectional surface of the fibers at the transition from the region in which the fibers are disposed on the fiber support to the region in which the fibers are not disposed on the fiber support remains substantially unchanged and round.

13. A light source for optical excitation of a laser device, comprising:
    a diode laser having a plurality of emitters; and
    a light-guiding device including a plurality of optical fibers each having a first end and a lateral surface, the first ends being situated relative to the emitters in such a manner that light generated by the emitters is coupled into the first ends of the optical fibers, wherein the optical fibers are arranged in abutting relationship along the lateral surfaces at least in the region of the first ends, and wherein the optical fibers are connected in the region of the first ends to a fiber support;

wherein the fibers include at least one first type of glass and the fiber support includes at least one second type of glass, and wherein the hardness of the second type of glass at room temperature is higher than the hardness of the first type of glass at room temperature.

14. A light source for optical excitation of a laser device, comprising:

a diode laser having a plurality of emitters; and a light-guiding device including a plurality of optical fibers each having a first end and a lateral surface, the first ends being situated relative to the emitters in such a manner that light generated by the emitters is coupled into the first ends of the optical fibers, wherein the optical fibers are arranged in abutting relationship along the lateral surfaces at least in the region of the first ends, and wherein the optical fibers are connected in the region of the first ends to a fiber support;

wherein the fibers include at least one first type of glass and the fiber support includes at least one second type of glass, and wherein the coefficient of thermal expansion of the first type of glass differs from the coefficient of thermal expansion of the second type of glass by no more than 5% in the temperature range between the lower end of the softening temperatures of the first and second types of glass and room temperature.

15. A method for producing a light source for optical excitation of a laser device, comprising:

placing a plurality of fibers on a fiber support;

heating the fibers placed on the fiber support, in the region of a first end of the fibers; and forming of a connection between the heated fibers and the fiber support;

wherein the fibers include at least one first type of glass and the fiber support includes at least one second type of glass, and wherein the softening temperature of the second type of glass is higher than the softening temperature of the first type of glass.

16. The method as recited in claim 15, wherein the fibers are arranged on the fiber support in abutting relationship with one another along the lateral surfaces at least in the region of the first ends.

17. The method as recited in claim 16, wherein a force is applied to the fibers one of during or after the heating, the force being oriented perpendicularly to the contact surface of the fibers on the fiber support.

18. The method as recited in claim 17, wherein, during the application of the force on the fibers, the fibers are disposed between the fiber support and a counter-surface, and wherein the applied force acts on the fibers via the counter-surface.

19. The method as recited in claim 18, wherein the counter-surface includes a heat-resistant material which does not form a connection to the fibers at a temperature of approximately 800° C.

20. The method as recited in claim 18, wherein the counter-surface is part of a second fiber support which is also bonded to the fibers.

21. The method as recited in claim 18, wherein, after the application of the force on the fibers, the fibers substantially completely fill the space between the fiber support and the counter-surface over the width of the fiber support in which the fibers are disposed on the fiber support.

22. The method as recited in claim 15, wherein softening of the fibers occurs upon heating of the fibers.

23. The method as recited in claim 15, wherein a force is applied to the fibers one of during or after the heating, and wherein the force is applied at an angle of from 0.1° to 2.5° to the normal of the contact surface of the fibers on the fiber support to achieve an uneven pressing.

24. The method as recited in claim 15, wherein a deformation of the fibers occurs during the formation of a connection between the heated fibers and the fiber support, and wherein an integral bond is formed between the fibers and the fiber support.

25. The method as recited in claim 24, wherein an integral bond among the fibers is avoided.

* * * * *